(12) United States Patent
Rochford et al.

(10) Patent No.: US 11,017,942 B2
(45) Date of Patent: May 25, 2021

(54) SYSTEMS AND METHODS FOR DETERMINING COIL CURRENT IN WIRELESS POWER SYSTEMS

(71) Applicant: WiTricity Corporation, Watertown, MA (US)

(72) Inventors: Conor Rochford, Newton, MA (US); Milisav Danilovic, Watertown, MA (US)

(73) Assignee: WITRICITY CORPORATION, Watertown, MA (US)

( * ) Notice: Subject to any disclaimer, the term of this patent is extended or adjusted under 35 U.S.C. 154(b) by 0 days.

(21) Appl. No.: 16/671,828

(22) Filed: Nov. 1, 2019

(65) Prior Publication Data

US 2020/0143982 A1  May 7, 2020

Related U.S. Application Data

(60) Provisional application No. 62/754,351, filed on Nov. 1, 2018.

(51) Int. Cl.
*H01F 38/14* (2006.01)
*H02J 50/12* (2016.01)
(Continued)

(52) U.S. Cl.
CPC .............. *H01F 38/14* (2013.01); *B60L 53/12* (2019.02); *B60L 53/122* (2019.02);
(Continued)

(58) Field of Classification Search
CPC .. H02J 50/12; H02J 50/10; H02J 50/60; H02J 7/025; H02J 7/045; B60L 53/12;
(Continued)

(56) References Cited

U.S. PATENT DOCUMENTS 10,027,186 B2 * 7/2018 Aikawa ................... H02J 7/025
10,076,966 B2 * 9/2018 Koizumi ................. H02J 50/80
(Continued)

FOREIGN PATENT DOCUMENTS

EP          3145047 A1      3/2017
KR       20170118573 A     10/2017

OTHER PUBLICATIONS

International Search Report and Written Opinion for PCT/2019/059441 dated Feb. 18, 2020, 13 pages.

*Primary Examiner* — Ryan Johnson
(74) *Attorney, Agent, or Firm* — Goodwin Procter LLP

(57) ABSTRACT

Disclosed herein are systems and methods for determining a current of a resonator coil during operation of a wireless power system having the resonator coil, in which the resonator coil is coupled to a fixed capacitive network and a reactance circuit. The systems and methods can include determining a first signal which can include receiving a current in an inductor of the reactance circuit; converting the current to a voltage signal; and scaling the voltage signal. The systems and methods can include determining a second signal which can include receiving an output voltage at an output of the reactance circuit; dividing the output voltage; and integrating the divided scaled voltage to produce an inverted differentiated voltage signal. The methods can include summing the first signal and the second signal to produce a summed signal; and determining the current in the resonator coil based on the summed signal.

20 Claims, 35 Drawing Sheets

(51) Int. Cl.
  *G01R 19/00* (2006.01)
  *B60L 53/12* (2019.01)
  *B60L 53/122* (2019.01)
  *B60L 53/124* (2019.01)
  *H02J 50/60* (2016.01)

(52) U.S. Cl.
  CPC .......... *G01R 19/0092* (2013.01); *H02J 50/12* (2016.02); *B60L 53/124* (2019.02); *H02J 50/60* (2016.02)

(58) Field of Classification Search
  CPC . B60L 53/122; B60L 53/124; G01R 19/0092; H04B 5/0037
  See application file for complete search history.

(56) References Cited

U.S. PATENT DOCUMENTS

| | | |
|---|---|---|
| 2007/0222542 A1 | 9/2007 | Joannopoulos et al. |
| 2008/0278264 A1 | 11/2008 | Karalis et al. |
| 2010/0141042 A1 | 6/2010 | Kesler et al. |
| 2015/0202970 A1 | 7/2015 | Huang et al. |
| 2017/0324351 A1 | 11/2017 | Rochford |
| 2020/0161901 A1* | 5/2020 | Tombelli ................ B60L 53/30 |

* cited by examiner

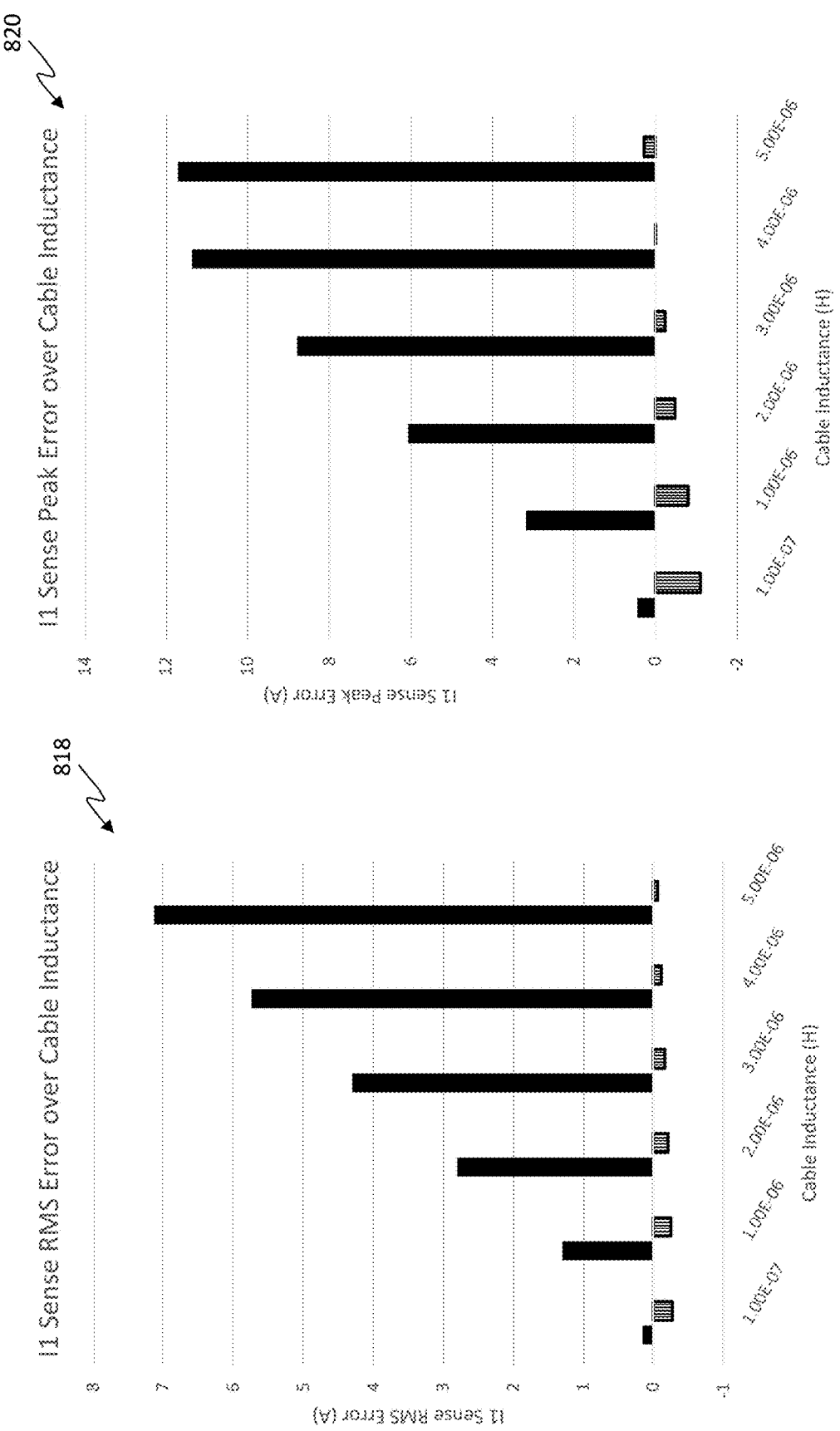

SYSTEMS AND METHODS FOR DETERMINING COIL CURRENT IN WIRELESS POWER SYSTEMS

CROSS-REFERENCE TO RELATED APPLICATIONS

This application claims priority and benefit under 35 U.S.C. § 119(e) of U.S. Provisional Patent Application No. 62/754,351, titled "System and methods for determining coil current in wireless power systems" and filed on Nov. 1, 2018, the entire contents of which are hereby incorporated by reference herein.

TECHNICAL FIELD

The following disclosure is directed to methods and systems for determining coil current in wireless power systems and, more specifically, methods and systems for determining coil current in wireless power systems without a direct measurement and with high accuracy.

BACKGROUND

Current measurements can typically be made using an ammeter or a current sense resistor. However, in complex electronic systems, it can be difficult to measure a current accurately and/or reliably without introducing loss or breaks into the systems.

SUMMARY

Determination of current can be particularly important in wireless power systems in which components can be loss-sensitive, leading to inefficient power transmission. In some cases, the efficiency and/or safe operation of wireless power system operation can depend on the accurate determination of current in the system. For example, the determination of the current can be provided to other components of the system and/or used to adjust parts of the system.

Disclosed herein are exemplary systems and methods for determining current in a resonator coil of a wireless power transmitter and/or wireless power receiver. As used herein, references to the current can include one or more characteristics of the current, e.g., the level of direct current (DC); the amplitude, frequency, phase, waveform, modulation, etc. of alternating current (AC); etc. In some embodiments, references to the amplitude of the current can include peak amplitude, peak-to-peak amplitude, root mean square (RMS) amplitude, etc. In some cases, determining the current can include measuring, calculating, sensing, and/or deriving the current. For example, determining the current $I_1$ can include determining one or more characteristics of the current $I_1$; using the current $I_1$ as an input can include using one or more characteristics of the current $I_1$ as an input; and so on.

In some embodiments, determining current (e.g., current $I_1$) can include determining the related voltage (e.g., voltage $V_{f1}$). For example, by determining the related voltage, the current can be determined using an amount of power associated with the wireless power system (e.g., the amount of power transmitted by the wireless power transmitter, the amount of power received by the wireless power receiver, the amount of power at the load, etc.) using Ohm's law as a function of time: current I(t)=power P(t)/voltage (V(t)). In another example, the current can be determined using a value of a resistor in the system using Ohm's law as a function of time: I(t)=V(t)/R. In another example, a processor (e.g., a microprocessor, a controller, etc.) can receive the value of the related voltage and output the value of the current. In another example, a voltage-to-current converter can be used to determine the current from the related voltage. In another example, determining the current from the related voltage will depend on whether the current is in-phase (or out-of-phase) with the voltage. By determining, receiving, or measuring the angle with which the current is out-of-phase with the voltage, the current can be determined using the above relationships and the following equations:

$$I_{amp} = \frac{V_{amp}}{\sqrt{R^2 + X^2}}$$

$$\theta = \mathrm{atan2}(X, R)$$

in which $V_{amp}$ is the amplitude of the voltage waveform, $I_{amp}$ is the amplitude of the current waveform, and $\theta$ is the phase angle (rad) (note that "atan2" is an arctangent function having two arguments). Note that V(t) is the measured voltage over the impedance including resistance R and reactance X. Other examples of using the related voltage to determine current include conventional methods known to a person skilled in the art.

In one aspect, the disclosure features methods for determining a current of a resonator coil during operation of a wireless power system having the resonator coil, in which the resonator coil is coupled to a fixed capacitive network and a reactance circuit. The methods can include determining a first signal. Determining the first signal can include receiving a current in an inductor of the reactance circuit; converting the current to a voltage signal; and scaling the voltage signal by a scaling term associated with a characteristic of a cable coupled between the reactance circuit and the fixed capacitive network. The methods can include determining a second signal. Determining the second signal can include receiving an output voltage at an output of the reactance circuit; dividing, by a voltage divider, the output voltage; and integrating, by an integrator circuit, the divided scaled voltage to produce an inverted differentiated voltage signal. The methods can include summing the first signal and the second signal to produce a summed signal; and determining the current in the resonator coil based on the summed signal.

Various embodiments of the methods can include one or more of the following features.

Converting the current to a voltage signal can be by a current sense transformer. The scaling term associated with the cable inductance can be: $1-L_C C_2 \omega^2$, wherein $L_C$ is the cable inductance and $C_2$ is a capacitance value of a first set of capacitors of the fixed capacitive network, in which the first set of capacitors coupled in parallel to the resonator coil. The methods can include filtering the summed signal prior to determining the current in the resonator coil. The filtering can be by a bandpass filter. Filtering of the summed signal can produce a fundamental frequency component of the summed signal. Determining the first signal further can include scaling the scaled voltage signal by a capacitance value of a first set of capacitors of the fixed capacitive network, in which the first set of capacitors coupled in parallel to the resonator coil. Scaling the voltage signal by the scaling term associated with the inductance of the cable can further include adjusting a gain of the voltage signal based on an inductance of the cable coupled between the reactance circuit and the fixed capacitive network. The adjusting of the gain can be by an adjusting circuit. The adjusting circuit can include a potentiometer.

The characteristic of the cable can be an inductance of the cable. The cable inductance can be a function of at least one of: cable length, wire gauge, insulation spacing, and/or insulation permeability. The second signal can further include scaling the integrated voltage signal by a capacitance value of a first set of capacitors of the fixed capacitive network, in which the first set of capacitors coupled in parallel to the resonator coil. The method can include adjusting one or more adjustable components in the wireless power transmitter based on the determined current. The adjustable components can include one or more transistors in the reactive circuit. The methods can include applying a predetermined polynomial curve fit on the current, in which the predetermined polynomial curve based on data collected on directly measured coil current.

In another aspect, the disclosure features systems for determining a current of a resonator coil during operation of a wireless power system having the resonator coil, in which the resonator coil coupled to a fixed capacitive network and a reactance circuit. The systems can include a first sub-circuit including a current sense transformer configured to receive a current in the reactance circuit and output a voltage signal proportional to the current; and a potentiometer divider and a gain stage, coupled to the current sense transformer and configured to scale the output voltage signal with a first gain to produce a first voltage signal, in which the first gain is based on a characteristic of a cable coupled between the reactance circuit and the fixed capacitive network. The systems can include a second sub-circuit including a voltage divider configured to (i) divide a voltage at an output of the reactance circuit and (ii) scale the output voltage of the reactance circuit by a square of the operating frequency; an integrator, coupled to the voltage divider and configured to integrate the divided voltage signal to produce an inverted differentiated signal; and a summing operational amplifier coupled to the first and second sub-circuits and configured to produce a summed voltage signal.

Various embodiments of the systems can include one or more of the following features.

The systems can include a scaling circuit coupled to an output of the gain stage and configured to scale the output voltage signal with a first scaling term. The systems can include a scaling circuit, coupled to the integrator and configured to scale the inverted differentiated signal with a second scaling term. The systems can include a bandpass filter coupled to the summing operational amplifier and configured to produce a voltage signal having a fundamental frequency component of the summed voltage signal. The systems can include a circuit configured to convert the summed voltage signal to a current signal.

BRIEF DESCRIPTION OF THE DRAWINGS

FIG. 8C is a graph of current sense root-mean-square (RMS) error (in amperes A) as a function of cable inductance (H). FIG. 8D is a graph of current sense peak error (A) as a function of cable inductance (H).

DETAILED DESCRIPTION

Disclosed herein are exemplary embodiments of systems and methods for the accurate determination of resonator coil current of a wireless power transmitter or wireless power receiver during operation of a wireless power system without direct measurement by a current sensor. As discussed further herein, it is important to accurately determine the transmitter or receiver coil current of a wireless power system to enable low-loss, efficient, and thermally stable operation of the coils or wireless power system. Additionally, if the coil current is unknown (and therefore not controlled), high currents may occur in the wireless power system. High current levels can lead to excessive magnetic fields between the coils or high electromagnetic interference (EMI) or electromagnetic compatibility (EMC) emissions. High magnetic fields may also be a hazard to rogue metallic objects that are inadvertently positioned between, on, or near the wireless power transmitter coil and/or receiver coil. An example coil current limit can be 78 A to keep the field foreign objects are exposed to under 3.9 mT. As used herein, accuracy refers to measuring coil current with a relative error less than 5% at current levels between 20% and 100% rated current. Note that the following description provides embodiments of systems and methods for determining coil current in a wireless power transmitter. However, the exemplary systems and methods described herein can be used to determine coil current in a wireless power receiver.

Wireless Power Systems

Figure 1A:
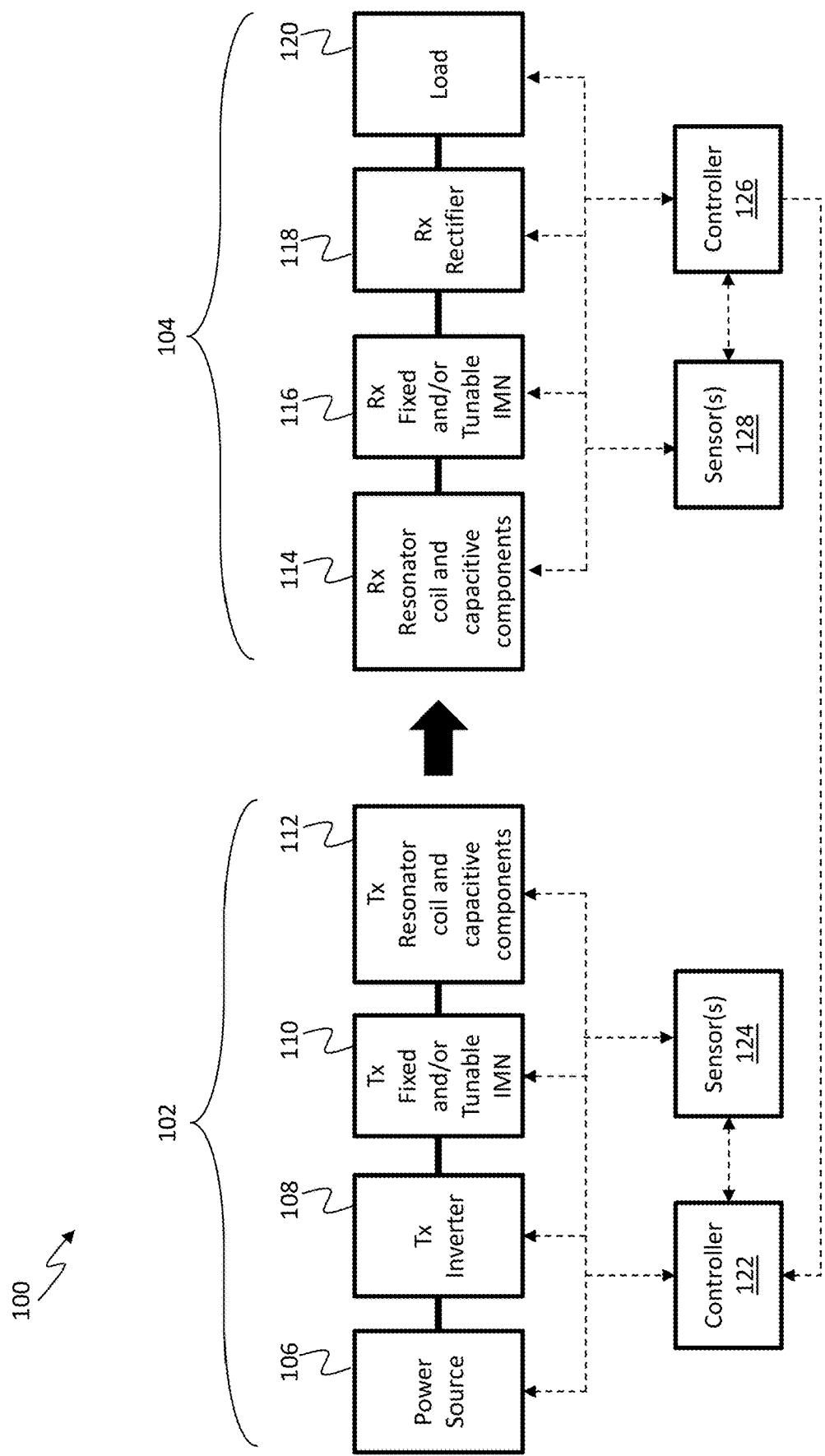
FIG. 1A is a block diagram of an exemplary wireless power system.

FIG. 1A is a block diagram of an exemplary wireless power system 100. The system 100 includes a wireless power transmitter 102 and a wireless power receiver 104. In transmitter 102, a power source 106 (e.g., AC mains, battery, etc.) provides power to an inverter 108. Additional components may include power factor correction (PFC) before the inverter stage 108. The inverter 108 drives the transmitter resonator coil and capacitive components 112 ("resonator"), via an impedance matching network 110 (having fixed and/or tunable network components). The resonator 112 produces an oscillating magnetic field which induces a voltage in receiver resonator 114. The received energy is provided to a rectifier 118 via impedance matching network 116 (having fixed and/or tunable network components). Ultimately, the rectified power is provided to a load 120 (e.g., one or more batteries of an electric or hybrid vehicle). In some embodiments, the battery voltage level can impact various parameters of the wireless power system 100. Therefore, the battery voltage level may be received, determined, or measured to be provided as input to the wireless power system. For example, typical battery voltage ranges for electric vehicles include 0-280 V, 0-350 V, 0-420 V, etc.

In some embodiments, one or more components of the transmitter 102 can be coupled to a controller 122, which may include a communication module (e.g., Wi-Fi, radio, Bluetooth, in-band signaling mechanism, etc.). In some embodiments, one or more components of the transmitter 102 can be coupled to one or more sensors 124 (e.g., a current sensor, a voltage sensor, a power sensor, a temperature sensor, a fault sensor, etc.).

In some embodiments, one or more components of the receiver 104 can be coupled to a controller 126, which may include a communication module (e.g., Wi-Fi, radio, Bluetooth, in-band signaling mechanism, etc.). In some embodiments, one or more components of the transmitter 104 can be coupled to one or more sensors 128 (e.g., a current sensor, a voltage sensor, a power sensor, a temperature sensor, a fault sensor, etc.).

Examples of wireless power systems can be found in U.S. Patent Application Publication No. 2010/0141042, published Jun. 10, 2010 and titled "Wireless energy transfer systems," and U.S. Patent Application Publication No. 2012/0112535, published May 10, 2012 and titled "Wireless energy transfer for vehicles," both of which are hereby incorporated by reference in their entireties. The exemplary systems and methods disclosed herein may be described with respect to a vehicle application but can also be applied to any system or apparatus powered by electricity, e.g., robots, industrial machines, appliances, consumer electronics, mobile devices, etc.

Figure 1B:
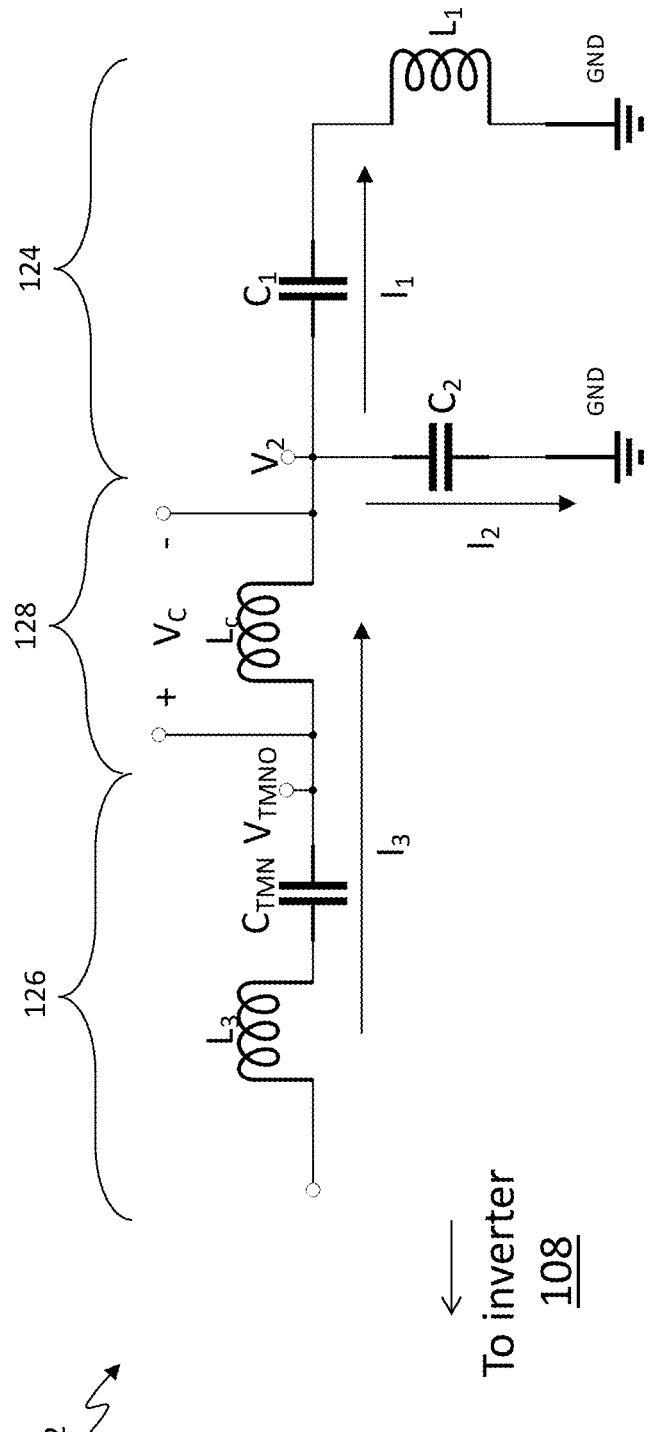
FIG. 1B is a schematic of an exemplary portion of a wireless power transmitter.

FIG. 1B is a schematic of an exemplary portion 122 of a wireless power transmitter 102. The circuit 122 illustrated includes a transmitter resonator coil $L_1$ coupled in series with capacitive component $C_1$, which are coupled in parallel to capacitive component $C_2$. Coupled in series to resonant circuit 124 is a tunable matching network (TMN) including tunable capacitive component $C_{TMN}$. Component $C_{TMN}$ is coupled in series to inductor $L_3$ and to inverter 108. TMNs can be used in adjusting the impedance (e.g., including the reactance) of the wireless power transmitter 102 and/or receiver 104. In some embodiments, tunable matching network(s) may referred to as "tunable reactance circuit(s)". In some applications such as wireless power transmission, impedances seen by the wireless power transmitter and receiver may vary dynamically. In such applications, impedance matching between a receiver resonator coil and a load, and a transmitter resonator coil and the power supply, may be required to prevent unnecessary energy losses and excess heat. The impedance experienced by a resonator coil may be dynamic, in which case, a dynamic impedance matching network can be provided to match the varying impedance to improve the performance of the system. In the case of the power supply in a wireless power system, the impedances seen by the power supply may be highly variable because of changes in the load receiving power (e.g., battery or battery charging circuitry) and changes in the coupling between the transmitter and receiver (caused, for example, by changes in the relative position of the transmitter and receiver resonator coils). Similarly, the impedance experienced by the receiver resonator may also change dynamically because of changes in the load receiving power. In addition, the desired impedance matching for the receiver resonator may be different for different coupling conditions and/or power supply conditions. Accordingly, power transmission systems transmitting and/or receiving power via highly resonant wireless power transfer, for example, may be required to configure or modify impedance matching networks to maintain efficient power transmission. Examples of tunable matching networks and tunable capacitive component $C_{TMN}$ can be found in U.S. Patent Application Publication No. 2017/0217325, published Aug. 3, 2017 and titled "Controlling wireless power transfer systems," and U.S. Patent Application Publication No. 2017/0229917, published Aug. 10, 2017 and titled "PWM capacitor control," both of which are hereby incorporated by reference in their entireties.

Figure 1C:
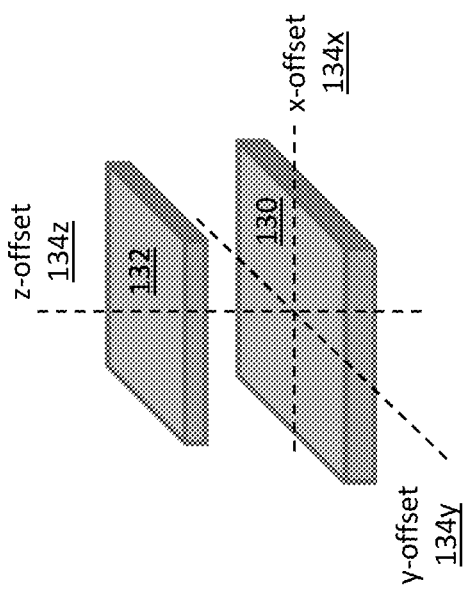
FIG. 1C is a diagram illustrating an exemplary embodiment of a wireless power transmitter coil positioned relative to receiver coil.

FIG. 1C is a diagram illustrating an exemplary embodiment of a wireless power transmitter coil 130 positioned relative to receiver coil 132. In particular, the diagram illustrates that the receiver coil 132 can be offset from the transmitter coil 130 with an x-offset 134x, a y-offset 134y, and/or a z-offset 134z. For example, a vehicle equipped with a wireless power receiver coil 132 may park over a wireless power transmitter coil 130 with zero or some offset in any axis. Therefore, typically, non-zero x-offset 134x and/or non-zero y-offset 134y can occur when the vehicle is parked such that the center of the receiver coil 132 is not aligned with the center of the transmitter coil 130. For a vehicle, example z-offsets 134z can include 140 mm (for, e.g., a sports car, a low-riding vehicle, etc.), 175 mm (for, e.g., a sedan, a hatchback, etc.), or 210 mm (for, e.g., a sports utility vehicle (SUV), a truck, etc.).

Determining Current in Wireless Power Systems

Various embodiments of wireless power systems 100 may require that portions 124 and 126 be separated by a cable 128. For example, in automotive applications, the resonant circuit 124 may be positioned directly under a vehicle to transmit power via the oscillating electromagnetic field to a receiver coupled to the bottom of a vehicle. Other portions of the transmitter 102, including portion 126, inverter 108, and/or other components (e.g., a PFC stage) between the inverter 108 and a power source 106 may be packaged separately and/or positioned apart from the resonant circuit 124. In this case, a cable 128 may be required to carry power from portion 126 to portion 124 of the transmitter 102. An exemplary cable 128 can be a power transmission cable having length A and characterized by an intrinsic inductance $L_C$, intrinsic capacitance $C_C$, and/or intrinsic resistance $R_C$. The voltage difference over the cable 128 is $V_C$. The inductance $L_C$ of an exemplary cable 128 can be a function of one or more of: the cable length, wire gauge, insulation spacing, and/or insulation permeability.

In some embodiments, component(s) of the wireless power transmitter 102 may be configured to sense or determine one or more characteristics (e.g., inductance $L_C$, capacitance $C_C$, and/or resistance $R_C$) of the cable 128. The component(s) may be able to provide feedback (e.g., the characteristic(s) of the cable 128, parameter(s) based on the characteristic(s) of the cable, etc.) to one or more of the systems and methods for determining coil current $I_1$ described herein. For example, the exemplary systems for determining current $I_1$ can include a microcontroller configured to control an adjusting circuit, e.g., digital potentiometer (e.g., a low-parasitic 64-position digital potentiometer) or programmable gain operation amplifier. The feedback can be used to automatically adjust one or more gain stages or scaling stages of systems configured to determine coil current $I_1$ (see, e.g., 906 and 908 in FIG. 9 or 1004 and 1006 in FIG. 10). In some embodiments, the digital potentiometer or programmable gain operation amplifier can be adjusted before transmission of power to account for the cable characteristics (e.g., inductance $L_C$, capacitance $C_C$, and/or resistance $R_C$).

In some embodiments, one or more adjustable components of the transmitter 102 may have coil current $I_1$ (or a characteristic thereof) as an input and/or may be adjusted according to the coil current $I_1$. In some embodiments, one or more adjustable components can adjust parameters related to the power transmission path of the wireless power transmitter 102. For example, adjustable component(s) can include TMN field-effect transistors (FETs) configured to adjust reactance of the TMN, inverter FETs configured to adjust voltage input into the IMN, and/or PFC FETs configured to adjust bus voltage input into the inverter 108. Such component(s) may require an input of the current $I_1$ in resonator coil $L_1$ to enable maximum and/or efficient power transfer while maintaining safe operation of the wireless power transmitter 102. In some embodiments, the determination of the resonator coil current $I_1$ can be used to limit the adjustable components in the power transmission path (e.g., TMN reactance, inverter FETs phase shift, and/or PFC FET duty cycle) if the resonator coil current $I_1$ exceeds a threshold dictated by thermal or magnetic field limitations.

Examples of tunable matching networks and tunable capacitive components $C_{TMN}$ can be found in U.S. Patent Application Publication No. 2017/0217325, published Aug. 3, 2017 and titled "Controlling wireless power transfer systems," and U.S. Patent Application Publication No. 2017/0229917, published Aug. 10, 2017 and titled "PWM capacitor control," both of which are hereby incorporated by reference in their entireties.

For example, if the transmitter resonator and receiver resonator are in a poor coupling position relative to one another such that an attempt for wireless power transmission to reach full power may cause the resonator coil current $I_1$ to exceed a limit such that particular safety and/or structural limits are exceeded (e.g., such that the thermal limits for the component(s) or packaging of the wireless power system and/or foreign object field exposure are beyond their maximum values), then one or more adjustable components in the power transmission path having coil current $I_1$ as an input can adjust to prevent the resonator coil current limit from being exceeded. This can typically result in a reduction in transmitted power but maintain safe limits with respect to field exposure to potential foreign objects and/or risk of overheating in or more portions of the wireless power system (e.g., resonator packaging, resonator coil, etc.). Moreover, the more accurate the coil current $I_1$ determination, the less margin required in the power transmission reduction to maintain magnetic fields below the maximum field to which foreign objects can be exposed and maximum temperatures the system can safely sustain.

As a practical matter, length A of cable 128 may vary from installation to installation. For example, for a wireless power system installation in a small home garage, length A between resonant circuit 124 and the remainder of transmitter 102 may need be relatively short, as compared to an installation in a large public garage which may require cable 128 of greater length. For example, length A of cable 128 can be in a range from 1.5 meters to 7.5 meters. To accommodate the variations in cable length, one or more components can be used. As discussed further below, by including adjustable components, the installation process of the wireless power system can be improved by enabling a technician to easily and quickly adjust the adjustable component(s) (e.g., digital potentiometer or programmable gain operational amplifier) of the system for determining resonator coil current on-site.

For at least the reasons stated above, it is beneficial to determine current $I_1$ in resonator coil $L_1$ with high accuracy. Exemplary systems and methods are provided herein for the determination of current $I_1$ in wireless power system 100 (e.g., including transmitter 102 and/or receiver 104). Moreover, exemplary systems and methods are provided for the adjustment of one or more components in systems configured to determine coil current $I_1$ to account for cable length A. It is understood that while some of the exemplary embodiments described herein are associated with the transmitter 102, the exemplary embodiments may be applied to and/or adapted for the determination of current in wireless power receiver 104.

Note that FIG. 1B is a simplified schematic in which each representative component of circuit 122 can each include one or more components. Thus, for example, components $L_1$, $L_C$, and/or $L_3$ can include one or more inductors or one or more components having inductive reactance whereas components $C_1$, $C_2$, and/or $C_{TMN}$ can include one or more capacitors or one or more components having capacitive reactance. It is understood that circuit 122 is intended to illustrate the concepts discussed herein and is not intended to be limiting. Further, there may be additional components (e.g., inductors, capacitors, transistors, diodes, etc.) not shown in FIG. 1B.

In various embodiments discussed herein, to determine resonator coil current $I_1$, any one or more of the following circuit parameters may be referenced:

(i) output voltage $V_{TMNO}$ of the TMN;
(ii) current $I_3$ in any one or more of component $C_{TMN}$, inductor $L_3$, or cable 128;
(iii) voltage $V_C$ in cable 128;
(iv) voltage $V_2$ in portion 124; and/or
(v) current $I_2$ in portion 124.

In at least some of the following embodiments, the performance of each exemplary system and/or method can be compared to a "control system and/or method." The control system and/or method is used to determine coil current $I_1$ using current $I_3$ and TMN output voltage $V_{TMNO}$. In this control system, one or more characteristics (e.g., the cable inductance $L_C$) of cable 128 was not accounted for when determining the coil current $I_1$. Thus, the voltage difference $V_C$ over the cable 128 was not factored into the determination of the coil current $I_1$. Further, the control system and/or method includes the differentiation of output voltage signal $V_{TMNO}$ ($dV_{TMNO}$), which can result in large, erroneous spikes in the coil current measurement due to the differentiation of large discontinuous steps in the voltage difference $V_C$ over the cable 128. To remedy this issue, one or more of the exemplary embodiments described herein include (i) the filtering of the subject signal (e.g., via bandpass filters); (ii) "blanking" or masking of the subject signal where spikes are preset; and/or (iii) replacing the differentiator with an inverting integrator and fixed gain to prevent large erroneous spikes. The bandpass filtering of these signals extracts its fundamental frequency component to be used for determining coil current $I_1$ and enables the system to replace the differentiator with the inverter integrator.

Note that because the coil current $I_1$ is primarily sinusoidal due to the selective filtering of the matching network 110, at least some of the following derivations solve for the fundamental frequency component of the current without creating much error (denoted by "M" in the relevant terms—e.g., "$I_{1M}$", "$I_{3M}$", "$V_{2M}$", etc.). In some embodiments, the solution for the fundamental frequency component may be used as an acceptable approximation for input. For example, fundamental component $I_{1M}$ of current $I_1$ may be used in place of current $I_1$.

Control Method and System

The control embodiment of a system and/or method for determining coil current $I_1$ can use the following derivation:

$$I_1 = I_3 - I_2 \quad (0.1)$$

$$I_1 = I_3 - C_2 \frac{dV_2}{dt} \quad (0.2)$$

$$I_1 \cong I_3 - C_2 \frac{dV_{TMNO}}{dt} \quad (0.3)$$

Figure 2A:
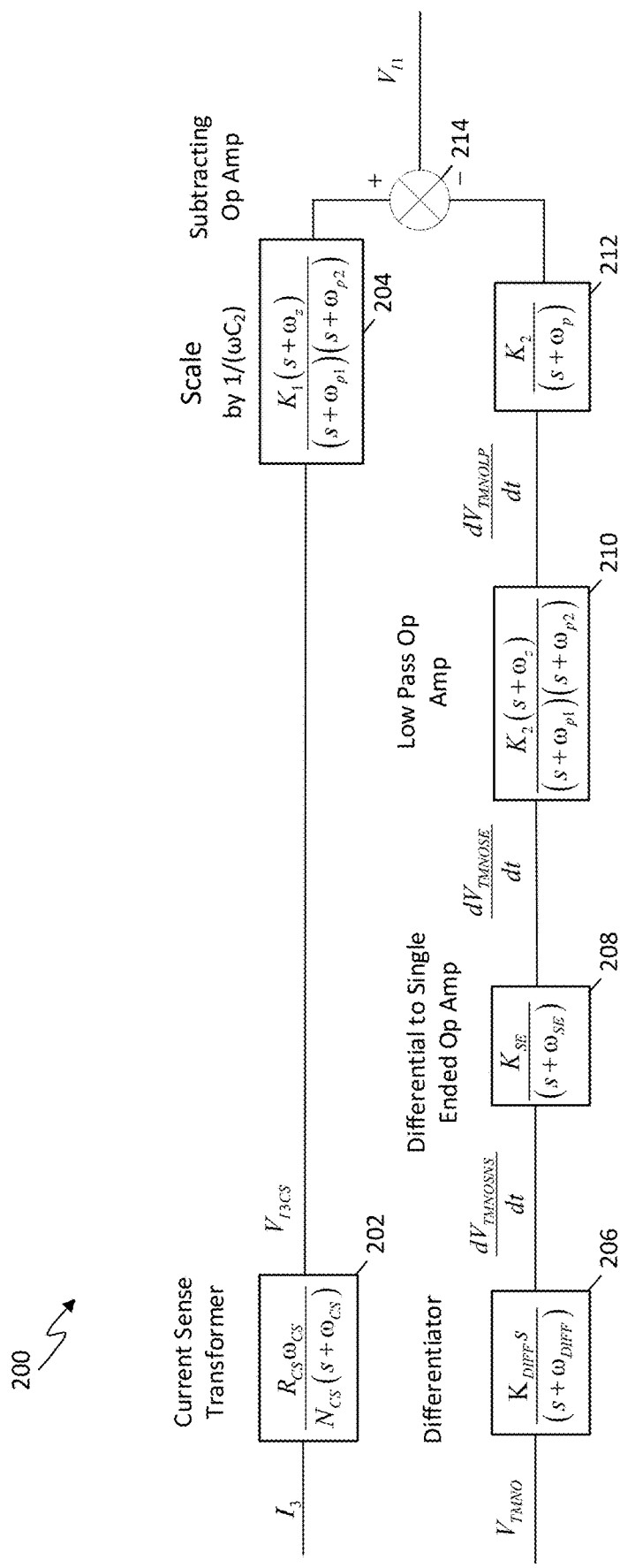
FIG. 2A is a block diagram of the control system and/or method for determining coil current $I_1$.

FIG. 2A is a block diagram of the control system and/or method for determining coil current $I_1$. The exemplary system and/or method 200 implements the above-derived step 0.3 with electronic signals and/or components (e.g., in hardware and/or software). Specifically, in the upper branch, a current sense transformer 202 receives current $I_3$ and produces an output voltage $V_{I3CS}$ proportional to current $I_3$. Voltage signal $V_{I3CS}$ is scaled by $1/(\omega C_2)$ in block 204. In the lower branch, a differentiator 206 receives output voltage $V_{TMNO}$ to produce differentiated signal $$\frac{dV_{TMNOSNS}}{dt}.$$

Differentiated signal $$\frac{dV_{TMNOSNS}}{dt}$$

is converted from a differential signal to a single ended signal with differential to single ended operational amplifier block 208. Single ended, differentiated signal $$\frac{dV_{TMNOSE}}{dt}$$

is filtered in low pass operational amplifier block 210. The filtered signal $$\frac{dV_{TMNOLP}}{dt}$$

is then scaled in block 212 for the total gain from current $I_2$ up to the negative input of subtracting block 214 to match the total gain from current $I_3$ up to the positive input of the subtracting block 214. Scaled signals from blocks 204 and 212 are subtracted via operational amplifier 214. The subtracted signal $V_{I1}$ may be input into a peak detector and/or analog-to-digital converter (ADC) for a microcontroller to use as an input for algorithms and fault detection mechanisms. The current signal $I_1$ may be determined from voltage signal $V_{I1}$ (e.g., using one or more of the techniques described above). The current signal $I_1$ may be used in adjusting one or more components of the wireless power system, as described above (see, e.g., section titled "Determining Current in Wireless Power Systems").

Figure 2B:
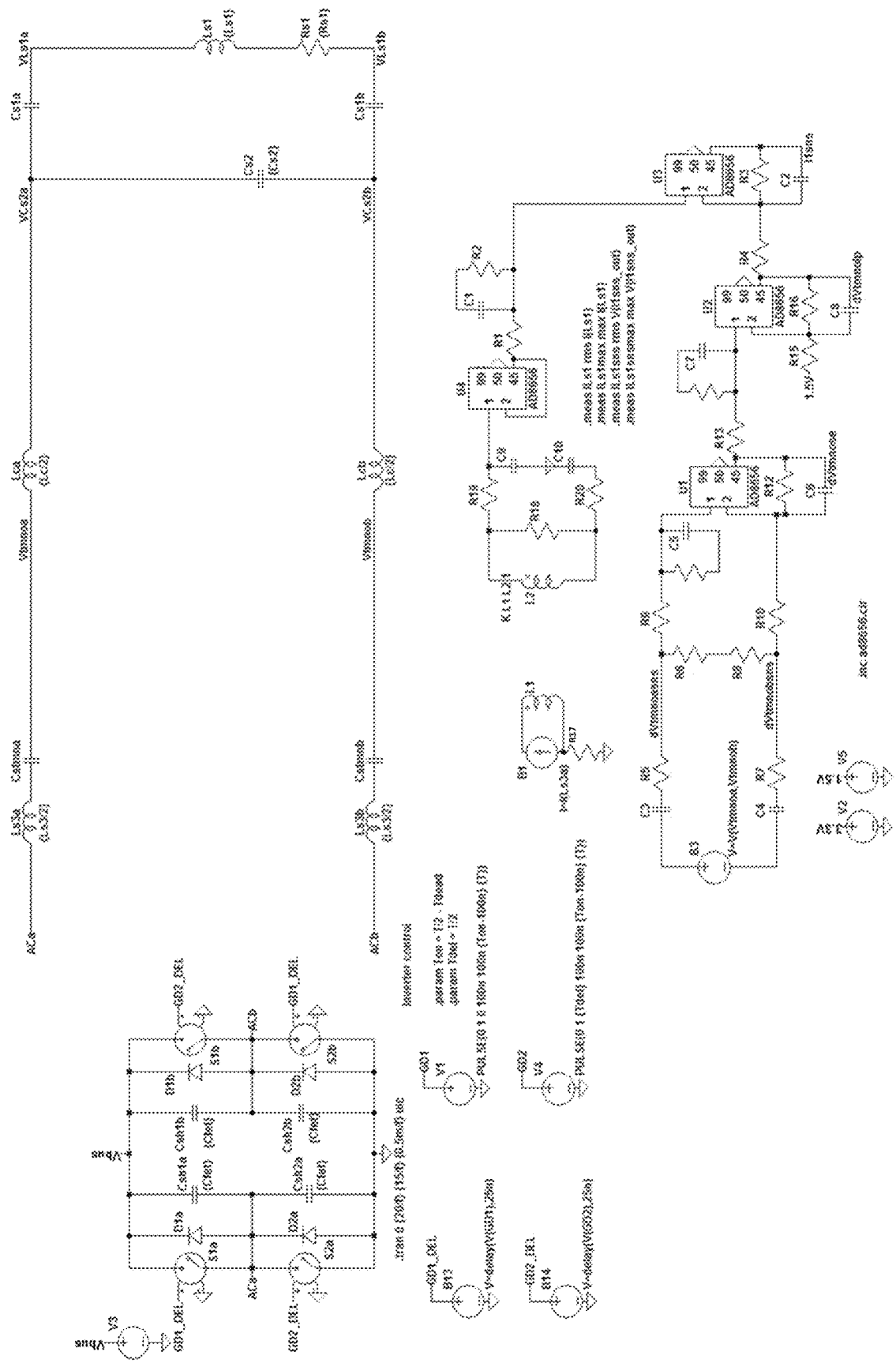
FIG. 2B is a schematic diagram of the control system of FIG. 2A for determining coil current $I_1$.

FIG. 2B is a schematic diagram of the control system 200 for determining coil current $I_1$.

First Embodiment

A first exemplary embodiment of a system and/or method for determining coil current $I_1$ can use the following derivation:

$$I_{1_M} = I_{3_M} - I_{2_M} \quad (1.1)$$

$$I_{1_M} = I_{3_M} - C_2 \frac{dV_{2_M}}{dt} \quad (1.2)$$

$$I_{1_M} = I_{3_M} - C_2 \frac{d(V_{TMNO_M} - V_{C_M})}{dt} \quad (1.3)$$

$$I_{1_M} = I_{3_M} - C_2 \frac{d\left(V_{TMNO_M} - L_C \frac{dI_{3_M}}{dt}\right)}{dt} \quad (1.4)$$

$$I_{1_M} = I_{3_M} - \left(C_2 \frac{dV_{TMNO_M}}{dt} - C_2 L_C \frac{d\left[\frac{dI_{3_M}}{dt}\right]}{dt}\right) \quad (1.5)$$

$$I_{1_M} = I_{3_M} - \left(C_2 \frac{dV_{TMNO_M}}{dt} - C_2 L_C [-\omega^2 I_{3_M}]\right) \quad (1.6)$$

$$I_{1_M} = I_{3_M} - \left(C_2 \frac{dV_{TMNO_M}}{dt} + L_C C_2 \omega^2 I_{3_M}\right) \quad (1.7)$$

Figure 3A:
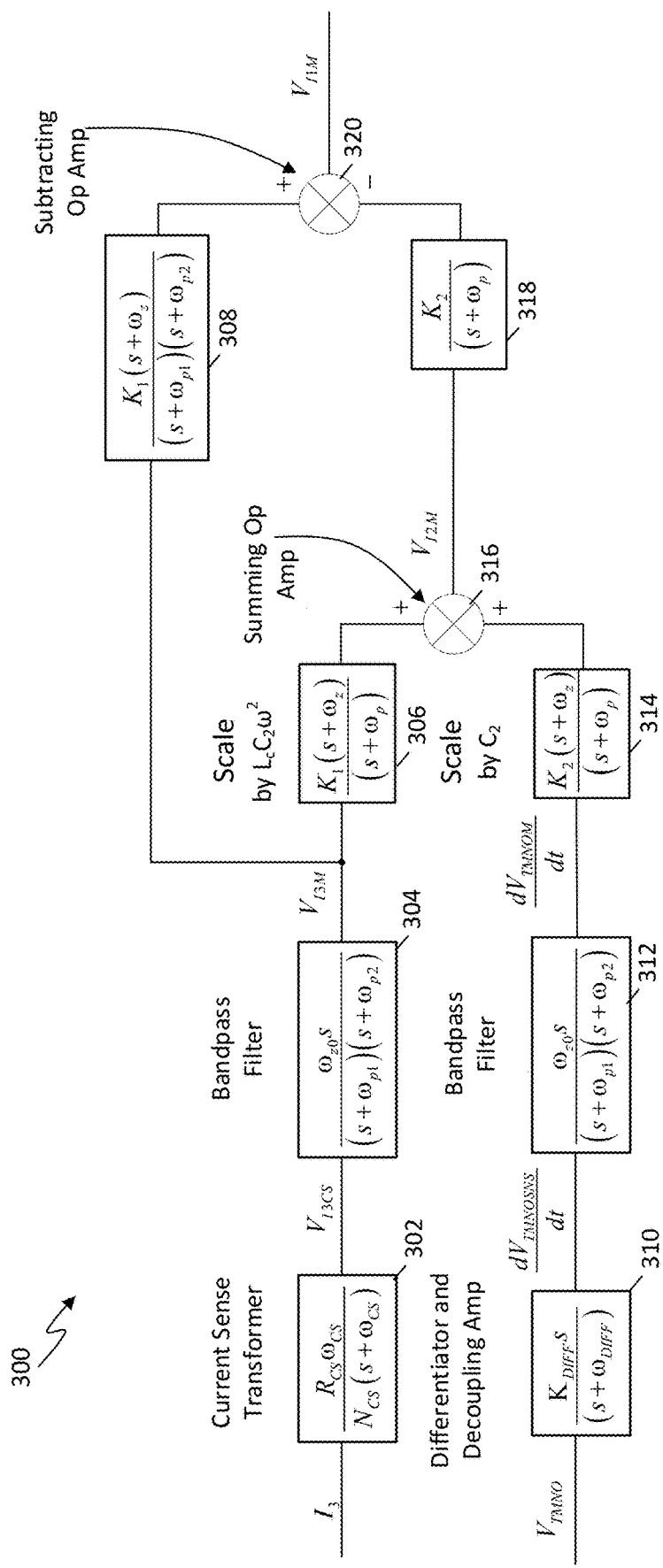
FIG. 3A is a block diagram of a first exemplary system and/or method for determining coil current $I_1$.

FIG. 3A is a block diagram of a first exemplary system and/or method for determining coil current $I_1$. The exemplary system and/or method 300 implements the above-derived step 1.7 with electronic signals and/or components (e.g., in hardware and/or software). Specifically, in the upper branch, a current sense transformer 302 receives current $I_3$ and produces an output voltage $V_{I3CS}$ proportional to current $I_3$. This voltage signal $V_{I3CS}$ is then filtered in bandpass filter 304 to produce a voltage signal $V_{I3M}$ having the fundamental frequency component of voltage signal $V_{I3CS}$. Voltage signal $V_{I3M}$ is scaled by $L_C C_2 \omega^2$ in block 306. Voltage signal $V_{I3M}$ is also scaled by block 308 for the total gain from current $I_3$ up to the positive input of subtracting block 320 to match the total gain from current $I_2$ up to the negative input of the subtracting block 320. In the lower branch, a differentiator and decoupling amplifier 310 receives output voltage $V_{TMNO}$ to produce differentiated signal $$\frac{dV_{TMNOSNS}}{dt}.$$

Differentiated signal $$\frac{dV_{TMNOSNS}}{dt}$$

is filtered in bandpass filter 312 to produce a differentiated signal $$\frac{dV_{TMNOM}}{dt}$$

having the fundamental frequency component of $$\frac{dV_{TMNOSNS}}{dt}.$$

Differentiated signal $$\frac{dV_{TMNOm}}{dt}$$

is scaled by the capacitance value of component(s) $C_2$ in block 314. Scaled signals from blocks 306 and 314 are added with a summing operational amplifier 316. The summed signal $V_{I2M}$ is scaled in block 318 for the total gain from current $I_2$ up to the negative input of subtracting block 320 to match the total gain from current $I_3$ up to the positive input of the subtracting block 320. Signals from blocks 308 and 318 are subtracted via subtracting operational amplifier 320 to produce voltage signal $V_{I1M}$, which can be input into a peak detector and/or analog-to-digital converter (ADC) for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., above under heading "Determining Current in Wireless Power Systems").

Figure 3B:
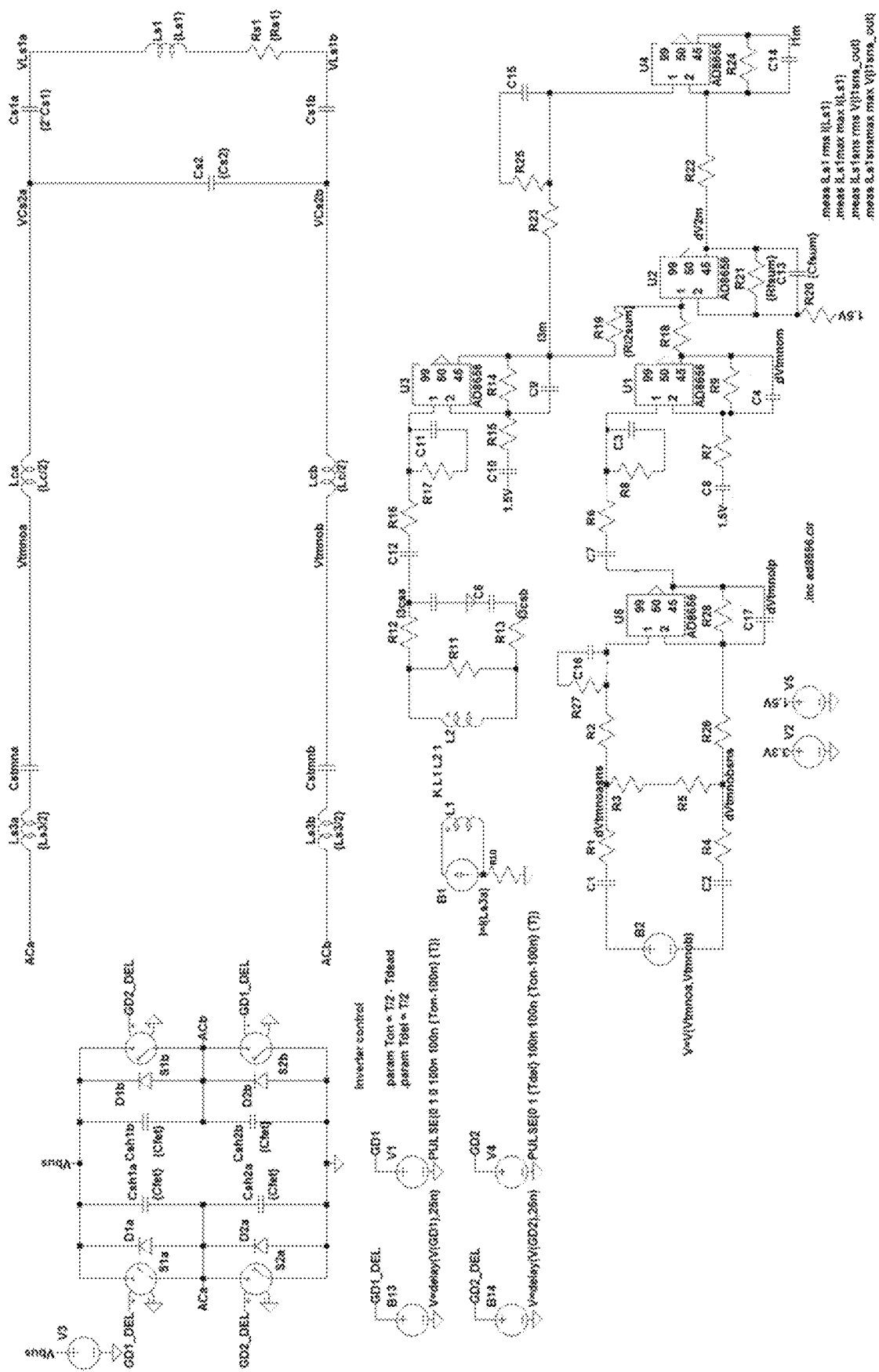
FIG. 3B is a schematic diagram of the first exemplary system of FIG. 3A for determining coil current $I_1$.

FIG. 3B is a schematic diagram of the first exemplary system 300 for determining coil current $I_1$. The diagrams of FIGS. 3A-3B illustrate that the system 300 can determine coil current $I_{1M}$ without a direct measurement at the transmitter resonator coil $L_1$. In other words, the system 300 can use as inputs current $I_3$ and output voltage $V_{TMNO}$ to ultimately determine coil current $I_1$.

Figures 3C, 3D:
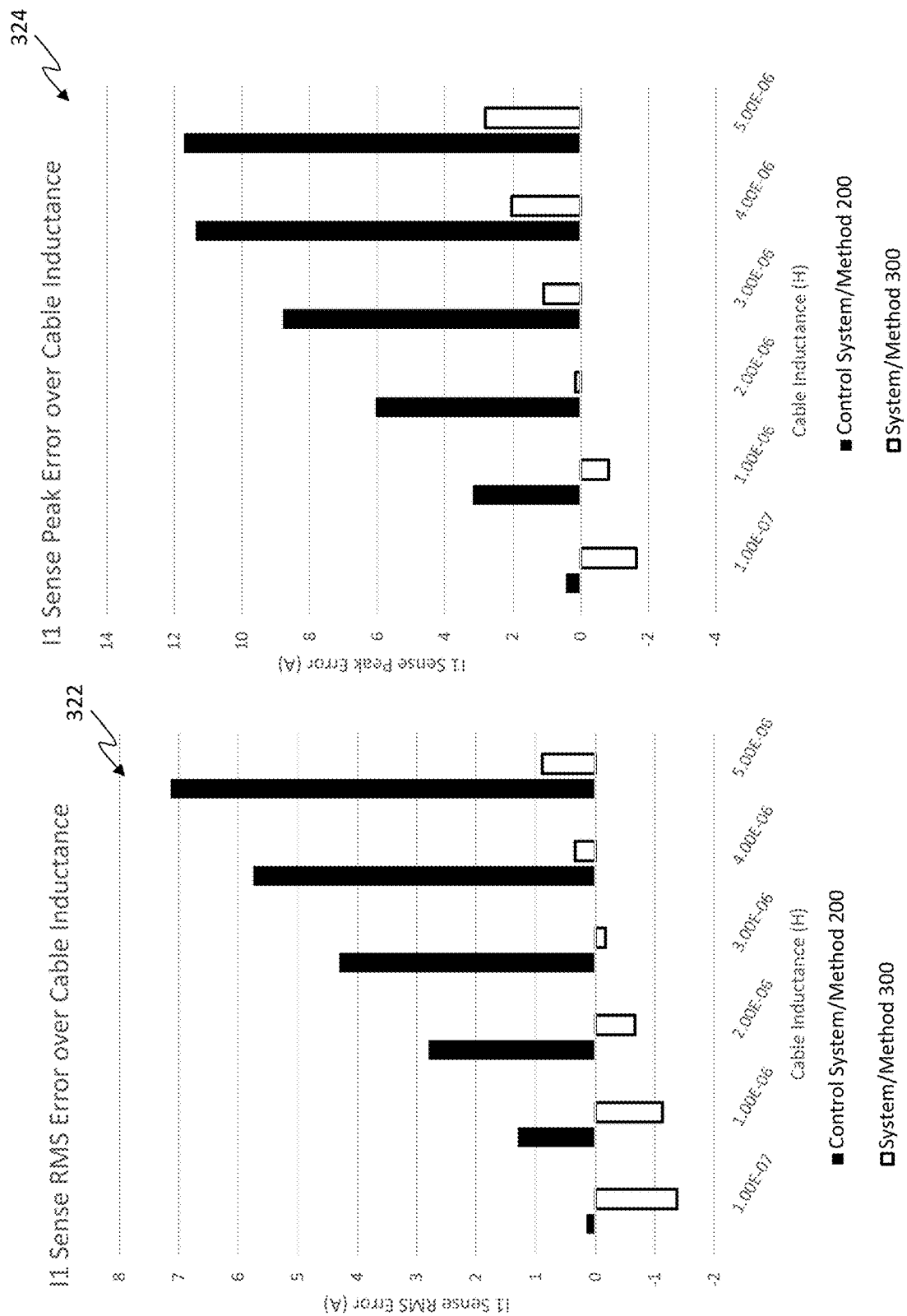
FIG. 3C is a graph of current sense root-mean-square (RMS) error (in amperes A) as a function of cable inductance (in henries H).
FIG. 3D is a graph of current sense peak error (A) as a function of cable inductance (H).

FIG. 3C is a graph 322 of current sense root-mean-square (RMS) error (in amperes A) as a function of cable inductance (in henries H). FIG. 3D is a graph 324 of current sense peak error (A) as a function of cable inductance (H). Specifically, the graphs 322 and 324 illustrate the improved performance of the system and/or method 300 (white bars with black outline) in comparison with the control system and/or method 200 (solid black bars), as described above, in determining coil current $I_1$. Notably, in system and method 300, the current sense RMS error of graph 322 is reduced to less than 1.4 A as compared to the control system and/or method 200 over the range of cable inductances $1 \times 10^{-7}$ H–$5 \times 10^{-6}$ H.

Second Embodiment

A second exemplary embodiment of a system and/or method for determining coil current $I_1$ can use following derivation:

$$I_{1_M} = I_{3_M} - I_{2_M} \quad (2.1)$$

$$I_{1_M} = I_{3_M} - C_2 \frac{dV_{2_M}}{dt} \quad (2.2)$$

$$I_{1_M} = I_{3_M} - C_2 \frac{d(V_{TMNO_M} - V_{C_M})}{dt} \quad (2.3)$$

$$I_{1_M} = I_{3_M} - C_2 \frac{d\left(V_{TMNO_M} - L_C \frac{dI_{3_M}}{dt}\right)}{dt} \quad (2.4)$$

Figure 4:
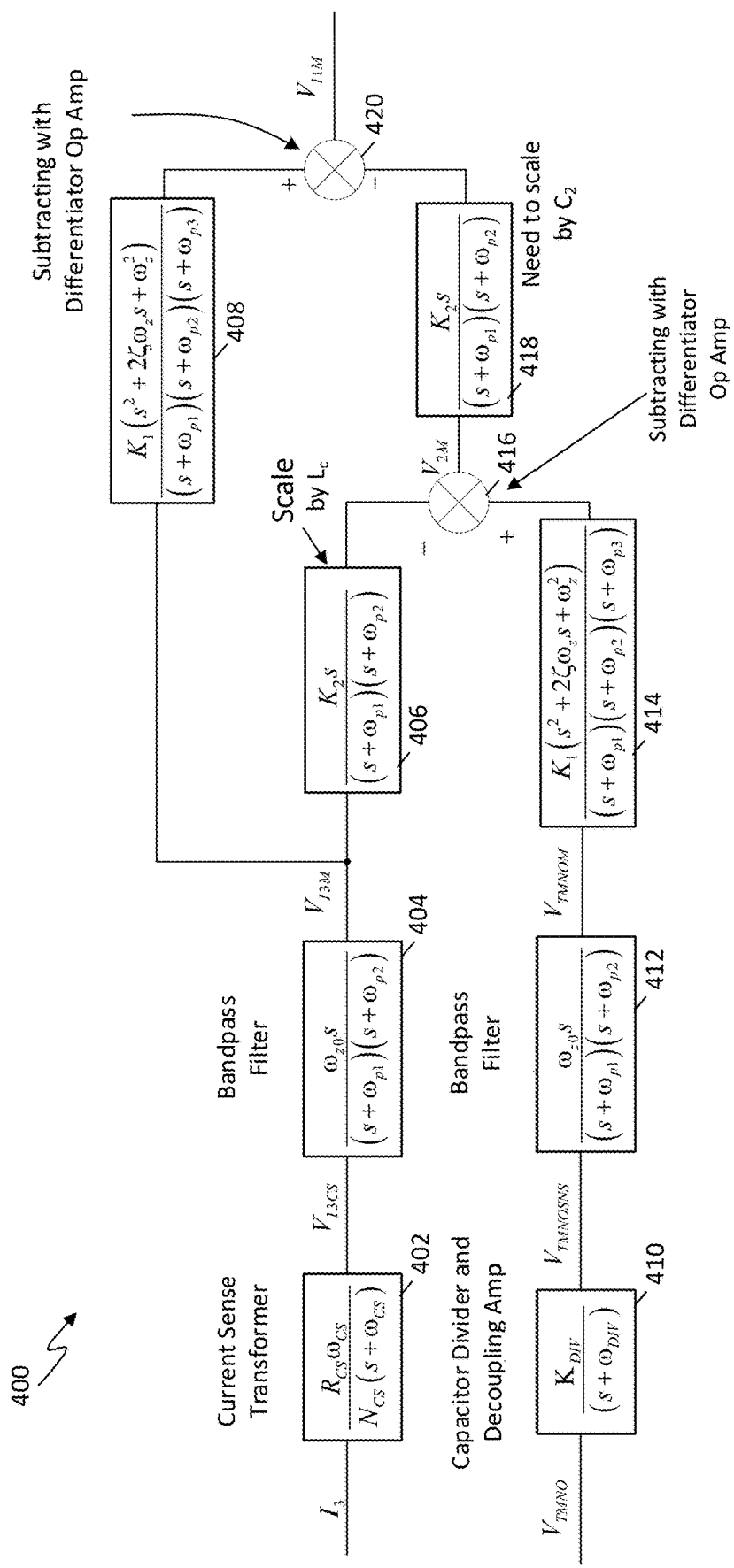
FIG. 4 is a block diagram of a second exemplary system and/or method for determining coil current $I_1$.

FIG. 4 is a block diagram of a second exemplary system and/or method for determining coil current $I_1$. The exemplary system and/or method 400 implements the above-derived step 2.4 with electronic signals and/or components (e.g., in hardware and/or software). Specifically, in the upper branch, a current sense transformer 402 receives current $I_3$ and produces an output voltage $V_{I3CS}$ proportional to current $I_3$. This voltage signal $V_{I3CS}$ is then filtered in bandpass filter 404 to produce a voltage signal $V_{I3M}$ having the fundamental frequency component of voltage signal $V_{I3CS}$. Voltage signal $V_{I3M}$ is differentiated and scaled by $L_C$ in block 406. Voltage signal $V_{I3M}$ is also scaled in block 408 for the total gain from current $I_3$ up to the positive input of subtracting block 420 to match the total gain from current $I_2$ up to the negative input of the subtracting block 420. In the lower branch, a capacitor divider and decoupling amplifier 410 receive output voltage $V_{TMNO}$ to produce voltage signal $V_{TMNOSNS}$. Voltage signal $V_{TMNOSNS}$ is filtered in bandpass filter 412 to produce a voltage signal $V_{TMNOM}$ having the fundamental frequency component of $V_{TMNOSNS}$. Voltage signal $V_{TMNOM}$ is scaled in to block 414 for the total gain from $V_{TMNO}$ to the positive input of the subtracting block 416 to match the total gain from $V_C$ up to the negative input of the subtracting block 416. Scaled signals from blocks 406 and 414 are subtracted with an operational amplifier 416. The signal $V_{2M}$ is scaled by value of component(s) $C_2$ and differentiated in block 418. Signals from blocks 408 and 418 are subtracted via operational amplifier 420 to produce voltage signal $V_{I1M}$, which can be input into a peak detector and/or analog-to-digital converter (ADC) for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems").

Third Embodiment

The third exemplary embodiment of a system and/or method for determining coil current $I_1$ can use following derivation:

$$I_1 = I_3 - I_2 \tag{3.1}$$

$$I_1 = I_3 - C_2 \frac{dV_2}{dt} \tag{3.2}$$

$$I_1 = I_3 - C_2 \frac{d(V_{TMNO} - V_C)}{dt} \tag{3.3}$$

$$I_1 = I_3 - C_2 \frac{d\left(V_{TMNO} - L_C \frac{dI_3}{dt}\right)}{dt} \tag{3.4}$$

Figure 5:
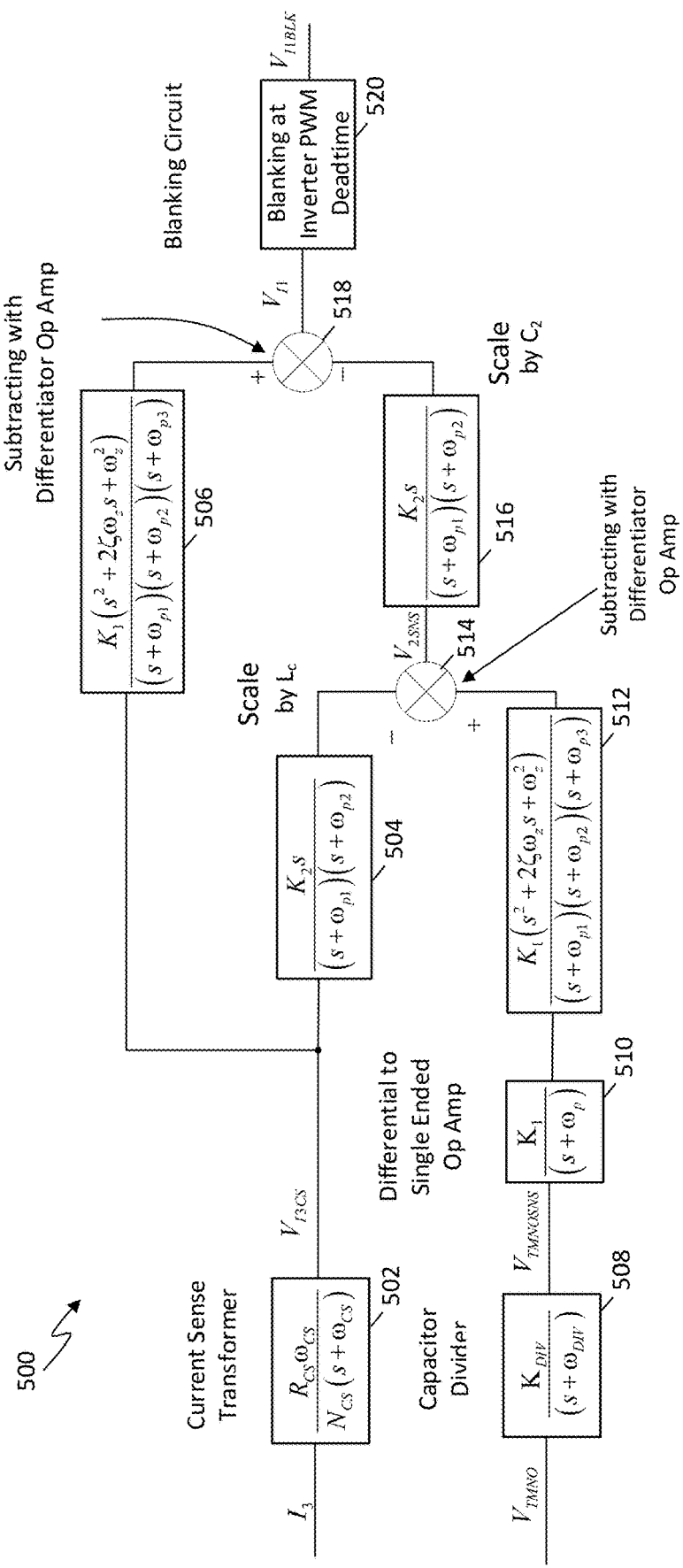
FIG. 5 is a block diagram of a third exemplary system and/or method for determining coil current $I_1$.

FIG. 5 is a block diagram of a third exemplary system and/or method for determining coil current $I_1$. The exemplary system and/or method 500 implements the above-derived step 3.4 with electronic signals and/or components (e.g., in hardware and/or software). Specifically, in the upper branch, a current sense transformer 502 receives current $I_3$ and produces an output voltage $V_{I3CS}$ proportional to $I_3$. This voltage signal $V_{I3CS}$ is differentiated and scaled by $L_C$ in block 504. Voltage signal $V_{I3M}$ is also scaled in block 506 for the total gain from $I_3$ up to the positive input of subtracting block 518 to match the total gain from $I_2$ up to the negative input of the subtracting block 518. In the lower branch, a capacitor divider 508 receives output voltage $V_{TMNO}$ to produce voltage signal $V_{TMNOSNS}$. Voltage signal $V_{TMNOSNS}$ is input into a block 510 to be converted to a single-ended signal with a differential to single-ended operational amplifier. This single-ended signal is then scaled by block 512 for the total gain from $V_{TMNO}$ to the positive input of the subtracting block 514 to match the total gain from $V_C$ up to the negative input of the subtracting block 514. Scaled signals from blocks 504 and 512 are subtracted with an operational amplifier 514. The signal $V_{2SNS}$ is differentiated and scaled by capacitance value of component(s) $C_2$ in block 516. Signals from blocks 506 and 516 are subtracted via operational amplifier 518 to produce voltage signal $V_{I1}$. This signal $V_{I1}$ is blanked during the dead time of the pulse width modulation signals driving the FETs in inverter 108 to mask any voltage spikes present in signal $V_{I1}$. These spikes are due to the differentiating the steps in the inductive voltage drop $V_C$ across cable 128. In this instance, blanking the signal $V_{I1}$ is used as an alternative to bandpass filtering to prevent spikes from propagating to the output of this system and/or method.

The blanking block 520 produces "blanked" signal $V_{I1BLK}$, which can be input into a peak detector and/or analog-to-digital converter for a microcontroller to use as an input for algorithms and fault detection mechanisms. The current signal $I_1$ may be determined from voltage signal $V_{I1BLK}$ (e.g., using one or more of the techniques described above). The current signal $I_1$ may be used in adjusting one or more components of the wireless power system, as described above (see, e.g., section titled "Determining Current in Wireless Power Systems").

Fourth Embodiment

A fourth exemplary embodiment of a system and/or method for determining coil current $I_1$ can use following derivation:

$$I_{1M} = I_{3M} - I_{2M} \tag{4.1}$$

$$I_{1M} = I_{3M} - C_2 \frac{dV_{2M}}{dt} \tag{4.2}$$

$$I_{1M} = I_{3M} - C_2 \frac{d(V_{TMNO_M} - V_{C_M})}{dt} \tag{4.3}$$

$$I_{1M} = I_{3M} - C_2 \frac{d\left(V_{TMNO_M} - L_C \frac{dI_{3M}}{dt}\right)}{dt} \tag{4.4}$$

$$I_{1M} = I_{3M} - \left(C_2 \frac{dV_{TMNO_M}}{dt} - C_2 L_2 \frac{d\left[\frac{dI_{3M}}{dt}\right]}{dt}\right) \tag{4.5}$$

$$I_{1M} = I_{3M} - \left(C_2 \frac{dV_{TMNO_M}}{dt} - C_2 L_2 [-\omega^2 I_{3M}]\right) \tag{4.6}$$

$$I_{1M} = I_{3M} - \left(C_2 \frac{dV_{TMNO_M}}{dt} + L_2 C_2 \omega^2 I_{3M}\right) \tag{4.7}$$

$$I_{1M} = I_{3M}(1 - L_2 C_2 \omega^2) - C_2 \frac{dV_{TMNO_M}}{dt} \tag{4.8}$$

Figure 6A:
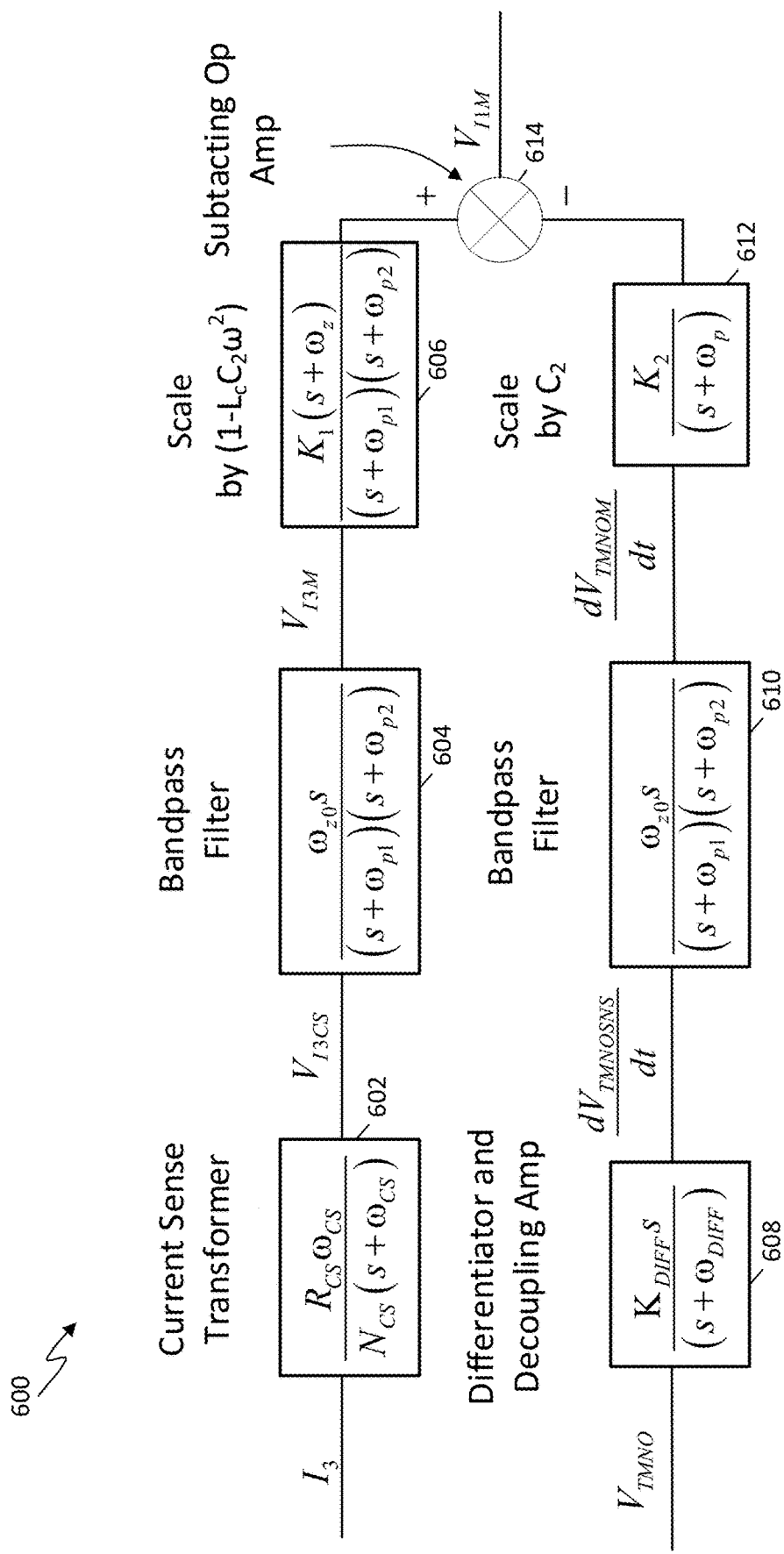
FIG. 6A is a block diagram of a fourth exemplary system and/or method for determining coil current $I_1$.

FIG. 6A is a block diagram of a fourth exemplary system and/or method for determining coil current $I_1$. The exemplary system and/or method 600 implements the above-derived step 4.8 with electronic signals and/or components (e.g., in hardware and/or software). Specifically, in the upper branch, a current sense transformer 602 receives current $I_3$ and produces an output voltage $V_{I3CS}$ proportional to $I_3$. This voltage signal $V_{I3CS}$ is then filtered in bandpass filter 604 to produce a voltage signal $V_{I3M}$ having the fundamental frequency component of $V_{I3CS}$. Voltage signal $V_{I3M}$ is scaled by $(1-L_C C_2 \omega^2)$ in block 606 to account for the voltage drop $V_C$ in the length of cable 128. This is feasible because the fundamental component of the voltage drop in the cable $V_{CM}$ is proportional to $-L_C C_2 \omega^2 I_{3M}$ as shown in equations 4.3 to 4.6. In the lower branch, a differentiator and decoupling amplifier block 608 receive output voltage $V_{TMNO}$ to produce differentiated signal $$\frac{dV_{TMNOSNS}}{dt}.$$

Differentiated signal $$\frac{dV_{TMNOSNS}}{dt}$$

is filtered in bandpass filter 610 to produce a differentiated signal $$\frac{dV_{TMNOM}}{dt}$$

having the fundamental frequency component of $$\frac{dV_{TMNOSNS}}{dt}.$$

Differentiated signal $$\frac{dV_{TMNOM}}{dt}$$

is scaled by the capacitance value of component(s) $C_2$ in block 612. Scaled signals from blocks 606 and 612 are subtracted with an operational amplifier 614, producing voltage signal $V_{I1M}$, which can be input into a peak detector and/or analog-to-digital converter for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems"). Note that this fourth embodiment reduces the number of summing and/or subtracting operational amplifiers used (as compared to some other embodiments) by accounting for the cable voltage drop $V_C$ in the gain of block 606, resulting in lower component costs in the transmitter 102.

Figure 6B:
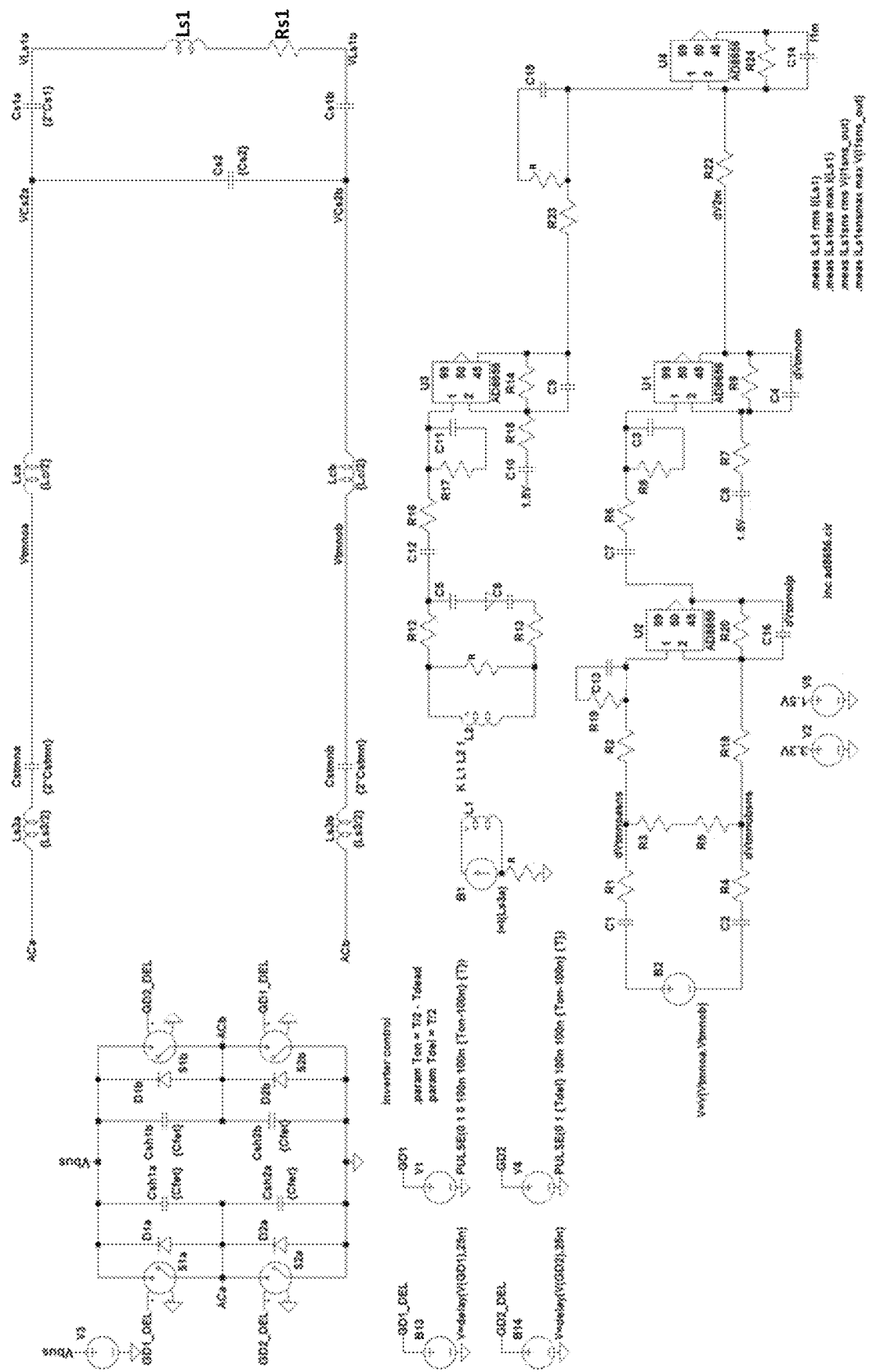
FIG. 6B is a schematic diagram of the fourth exemplary system of FIG. 6A for determining coil current $I_1$.

FIG. 6B is a schematic diagram of the fourth exemplary system 600 for determining coil current $I_1$. The diagrams of FIGS. 6A-6B illustrate that the system 600 can determine coil current $I_{1M}$ without a direct measurement at the transmitter resonator coil $L_1$. In other words, the system 600 can use as inputs current $I_3$ and output voltage $V_{TMNO}$ to ultimately determine coil current $I_1$.

Figures 6C, 6D:
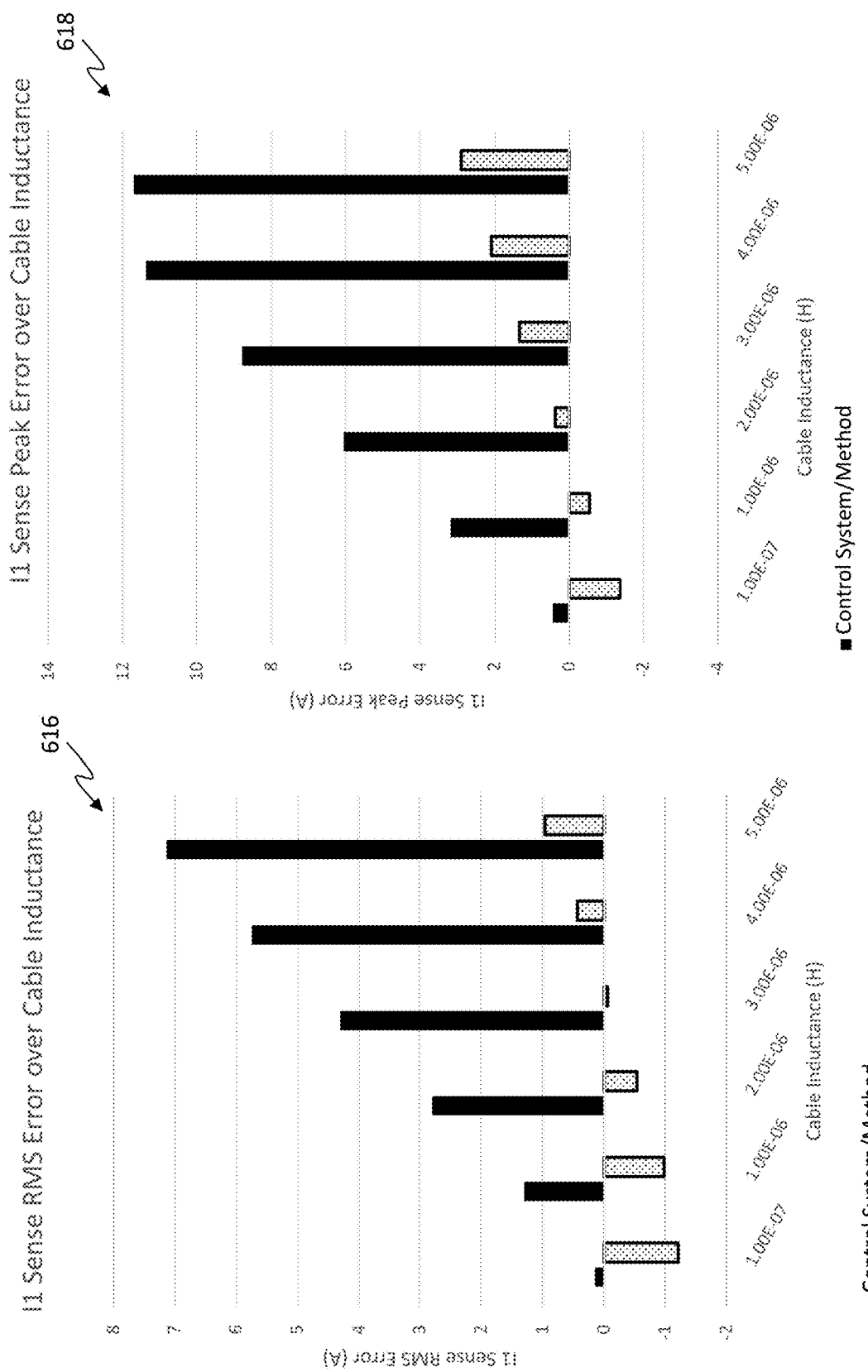
FIG. 6C is a graph of current sense root-mean-square (RMS) error (in amperes A) as a function of cable inductance (H).
FIG. 6D is a graph of current sense peak error (A) as a function of cable inductance (H).

FIG. 6C is a graph 616 of current sense root-mean-square (RMS) error (in amperes A) as a function of cable inductance (in henries H). FIG. 6D is a graph 618 of current sense peak error (A) as a function of cable inductance (H). Specifically, the graphs 616 and 618 illustrate the improved performance of the system and/or method 600 (dotted bars with black outline) in comparison with the control system and/or method 200 (solid black bars), as described above, in determining coil current $I_1$. Notably, in system and/or method 600, the current sense RMS error of graph 616 is reduced to less than 1.3 A as compared to the control system and/or method 200 over the range of cable inductances $1\times10^{-7}$ H–$5\times10^{-6}$ H.

Fifth Embodiment

A fifth exemplary embodiment of a system and/or method for determining coil current $I_1$ can use following derivation:

$$I_{1_M} = I_{3_M} - I_{2_M} \tag{5.1}$$

$$I_{1_M} = I_{3_M} - C_2 \frac{dV_{2_M}}{dt} \tag{5.2}$$

$$I_{1_M} = I_{3_M} - C_2 \frac{d(V_{TMNO_M} - V_{C_M})}{dt} \tag{5.3}$$

$$I_{1_M} = I_{3_M} - C_2 \frac{d\left(V_{TMNO_M} - L_C \frac{dI_{3_M}}{dt}\right)}{dt} \tag{5.4}$$

$$I_{1_M} = I_{3_M} - \left(C_2 \frac{dV_{TMNO_M}}{dt} - C_2 \left[L_C \frac{d\left\{\frac{dI_{3_M}}{dt}\right\}}{dt}\right]\right) \tag{5.5}$$

$$I_{1_M} = I_{3_M} - C_2 \frac{dV_{TMNO_M}}{dt} - C_2[L_C\{-\omega^2 I_{3_M}\}] \tag{5.6}$$

$$I_{1_M} = I_{3_M} \left(C_2\left[-\omega^2 \int V_{TMNO_M} dt\right] + L_C C_2 \omega^2 I_{3_M}\right) \tag{5.7}$$

$$I_{1_M} = I_{3_M}(1 - L_C C_2 \omega^2) - C_2 \omega^2 \int V_{TMNO_M} dt \tag{5.8}$$

Figure 7A:
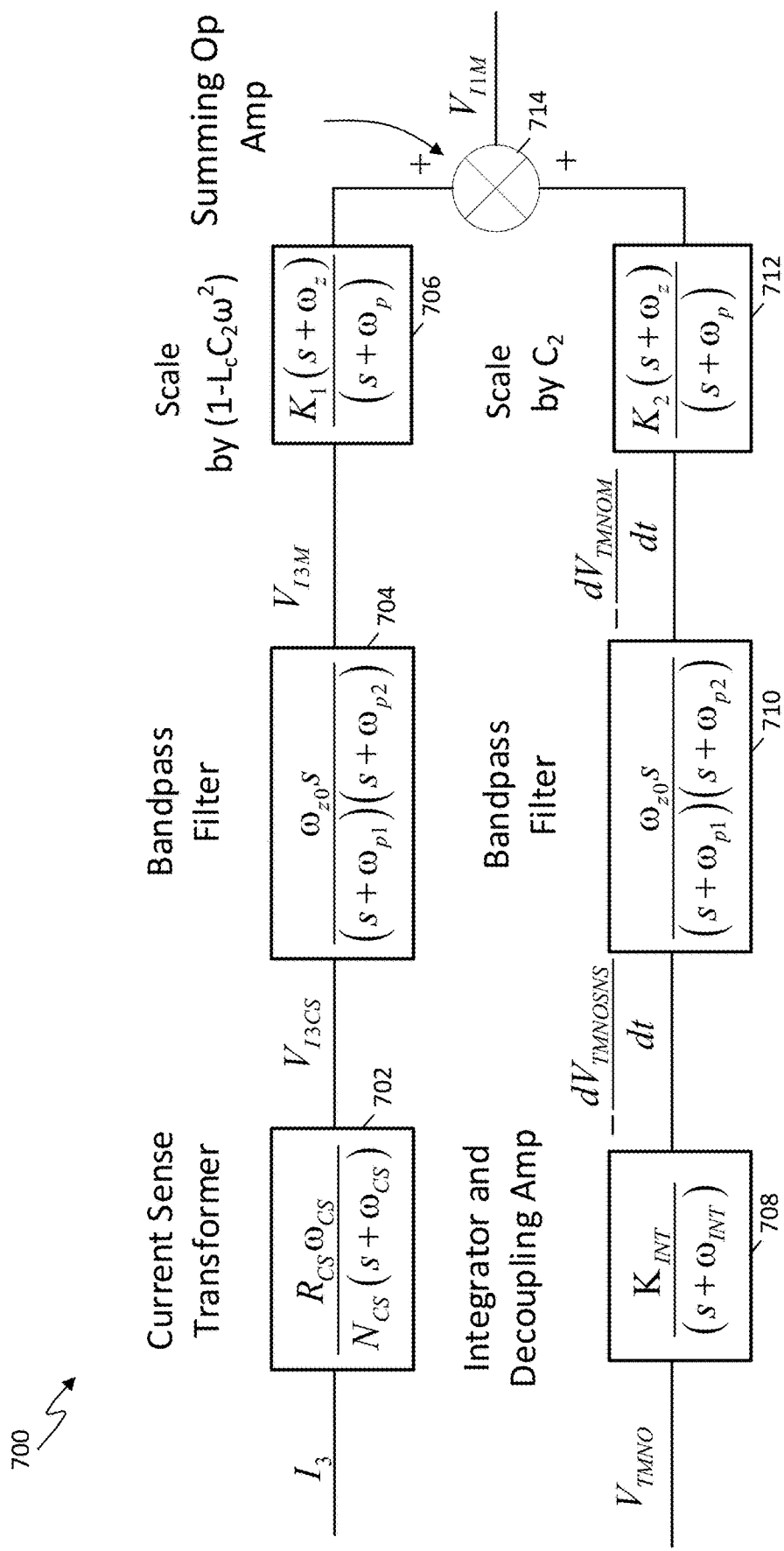
FIG. 7A is a block diagram of a fifth exemplary system and/or method for determining coil current $I_1$.

FIG. 7A is a block diagram of a fifth exemplary system and/or method for determining coil current $I_1$. The exemplary system and/or method 700 implements the above-derived step 5.8 with electronic signals and/or components (e.g., in hardware and/or software). Specifically, in the upper branch, a current sense transformer 702 receives current $I_3$ and produces an output voltage $V_{I3CS}$ proportional to current $I_3$. This voltage signal $V_{I3CS}$ is then filtered in bandpass filter 704 to produce a voltage signal $V_{I3M}$ having the fundamental frequency component of $V_{I3CS}$. Voltage signal $V_{I3M}$ is scaled by $(1-L_C C_2 \omega^2)$ in block 706 to account for the length of cable 128. This is feasible because the fundamental component of the voltage drop in the cable $V_{CM}$ is proportional to $-L_C C_2 \omega^2 I_{3M}$ as shown in equations 5.3 to 5.6. In the lower branch, an integrator and decoupling amplifier block 708 receive output voltage $V_{TMNO}$ to produce an inverted, differentiated signal $$-\frac{dV_{TMNOSNS}}{dt}.$$

Replacing the differentiator stage with an integrator stage is possible when using the fundamental frequency component of a signal because the relationship between the integration and differentiation of a sinusoidal waveform is proportional with the scaling term equal to $-\omega^2$ where $\omega$ is the angular frequency of the sine wave. The voltage signal $$-\frac{dV_{TMNOSNS}}{dt}$$

is filtered in bandpass filter 710 to produce a voltage signal $$-\frac{dV_{TMNOM}}{dt}$$

having the fundamental frequency component of $$-\frac{dV_{TMNOSNS}}{dt}.$$

By integrating voltage signal $V_{TMNO}$ (instead of differentiating), signal the discontinuous step components in $V_{TMNO}$ from the inductive voltage drop across the cable $V_C$ are further attenuated. Integrating the voltage signal $V_{TMNO}$ also creates an inverted differentiated signal $$-\frac{dV_{TMNOSNS}}{dt}$$

such that it is ultimately summed with the output from 706 (instead of subtracting from the output of 706). Signal $$-\frac{dV_{TMNOM}}{dt}$$

is scaled by the capacitance value of component(s) $C_2$ in block 712. Scaled signals from blocks 706 and 712 are added with a summing operational amplifier 714, producing voltage signal $V_{I1M}$, which can be input into a peak detector and/or analog-to-digital converter (ADS) for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems").

Figure 7B:
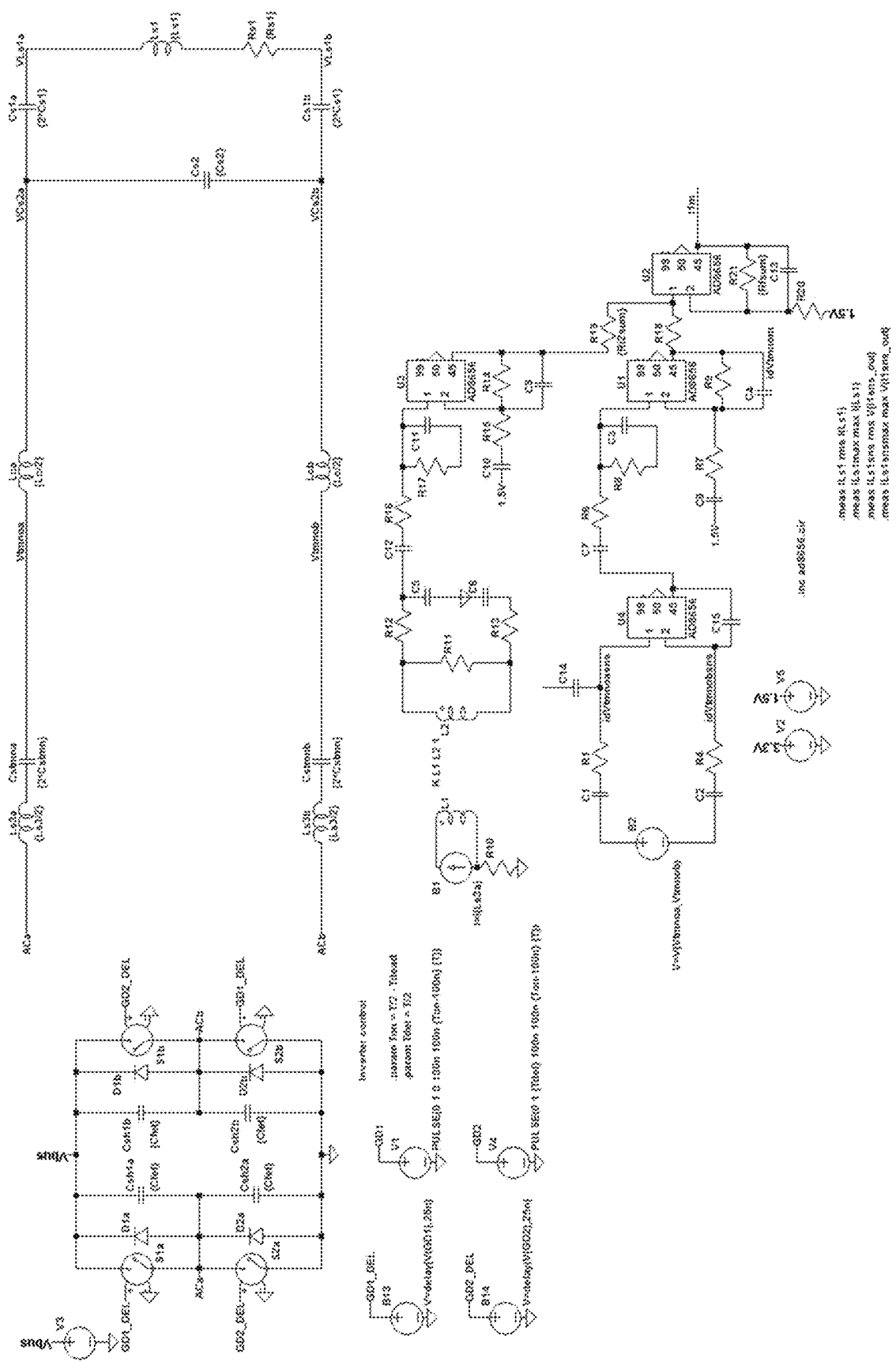
FIG. 7B is a schematic diagram of the fifth exemplary system of FIG. 7A for determining coil current $I_1$.

FIG. 7B is a schematic diagram of the fifth exemplary system 700 for determining coil current $I_1$. The diagrams of FIGS. 7A-7B illustrate that the system 700 can determine coil current $I_{1M}$ without a direct measurement at the transmitter resonator coil $L_1$. In other words, the system 700 can use as inputs current $I_3$ and output voltage $V_{TMNO}$ to ultimately determine coil current $I_1$.

Figures 7C, 7D:
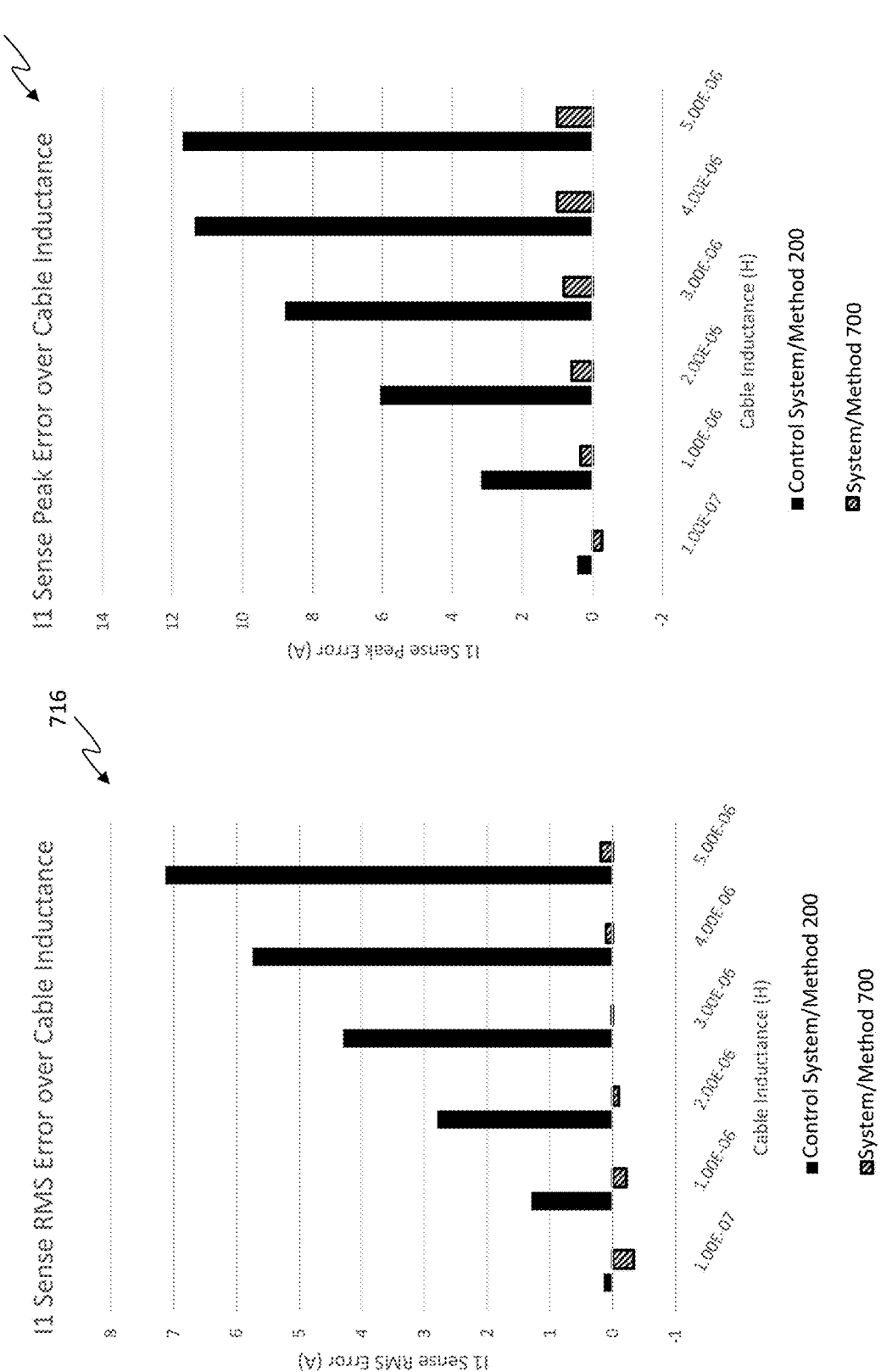
FIG. 7C is a graph of current sense root-mean-square (RMS) error (in amperes A) as a function of cable inductance (H).
FIG. 7D is a graph of current sense peak error (A) as a function of cable inductance (H).

FIG. 7C is a graph 716 of current sense root-mean-square (RMS) error (in amperes A) as a function of cable inductance (in henries H). FIG. 7D is a graph 718 of current sense peak error (A) as a function of cable inductance (H). Specifically, the graphs 716 and 718 illustrate the improved performance of the system and/or method 700 (diagonal striped bars with black outline) in comparison with the control system and/or method 200 (solid black bars), as described above, in determining coil current $I_1$. Notably, in system and method 700, the current sense RMS error of graph 716 is reduced to less than 0.4 A as compared to the control system and method 200 over the range of cable inductances $1 \times 10^{-7}$ H–$5 \times 10^{-6}$ H.

Sixth Embodiment

A sixth exemplary embodiment of a system and/or method for determining coil current $I_1$ can use following derivation:

$$I_{1M} = I_{3M} - I_{2M} \tag{6.1}$$

$$I_{1M} = I_{3M} - C_2 \frac{dV_{2M}}{dt} \tag{6.2}$$

$$I_{1M} = I_{3M} - C_2 \frac{d(V_{TMNO_M} - V_{C_M})}{dt} \tag{6.3}$$

$$I_{1M} = I_{3M} - C_2 \frac{d\left(V_{TMNO_M} - L_C \frac{dI_{3M}}{dt}\right)}{dt} \tag{6.4}$$

$$I_{1M} = I_{3M} - \left(C_2 \frac{dV_{TMNO_M}}{dt} - C_2\left[L_C \frac{d\left\{\frac{dI_{3M}}{dt}\right\}}{dt}\right]\right) \tag{6.5}$$

$$I_{1M} = I_{3M} - \left(C_2 \frac{dV_{TMNO_M}}{dt} - C_2[L_C\{-\omega^2 I_{3M}\}]\right) \tag{6.6}$$

$$I_{1M} = I_{3M} - \left(C_2\left[-\omega^2 \int V_{TMNO_M} dt\right] + L_C C_2 \omega^2 I_{3M}\right) \tag{6.7}$$

$$I_{1M} = I_{3M}(1 - L_C C_2 \omega^2) + C_2 \omega^2 \int V_{TMNO_M} dt \tag{6.8}$$

Figure 8A:
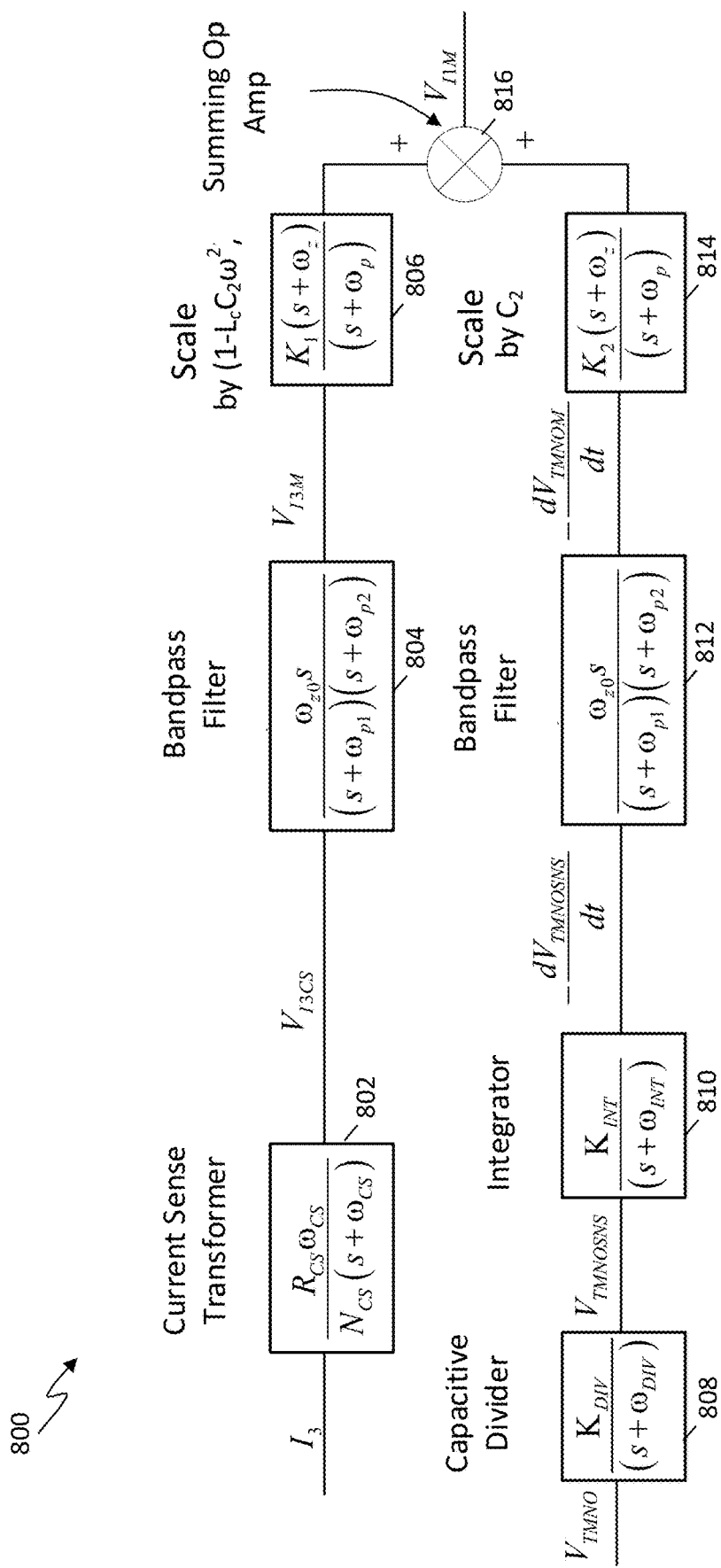
FIG. 8A is a block diagram of a sixth exemplary system and/or method for determining coil current $I_1$.

FIG. 8A is a block diagram of a sixth exemplary system and/or method for determining coil current $I_1$. The exemplary system and/or method 800 implements the above-derived step 6.8 with electronic signals and/or components (e.g., in hardware and/or software). Specifically, in the upper branch, a current sense transformer 802 receives current $I_3$ and produces an output voltage $V_{I3CS}$ proportional to current $I_3$. This voltage signal $V_{I3CS}$ is then filtered in bandpass filter 804 to produce a voltage signal $V_{I3M}$ having the fundamental frequency component of voltage signal $V_{I3CS}$. Voltage signal $V_{I3M}$ is scaled by $(1-L_C C_2 \omega^2)$ in block 806 to account for the length of cable 128. This is feasible because the fundamental component of the voltage drop in the cable $V_{CM}$ is proportional to $-L_C C_2 \omega^2 I_{3M}$ as shown in equations 6.3 to 6.6.

In the lower branch, a voltage divider 808 receives output voltage $V_{TMNO}$ to produce divided voltage signal $V_{TMNOSNS}$. Integrator block 810 receives signal $V_{TMNOSNS}$ and produces negative differentiated signal $$-\frac{dV_{TMNOSNS}}{dt}.$$

Voltage signal $$-\frac{dV_{TMNOSNS}}{dt}$$

is filtered in bandpass filter 810 to produce a voltage signal $$-\frac{dV_{TMNOM}}{dt}$$

having the fundamental frequency component of $$-\frac{dV_{TMNOSNS}}{dt}.$$

By integrating voltage signal $V_{TMNO}$ (instead of differentiating), the discontinuous step components in $V_{TMNO}$ from the inductive voltage drop across the cable $V_C$ are further attenuated. Integrating the voltage signal $V_{TMNO}$ also creates an inverted differentiated signal $$-\frac{dV_{TMNOSNS}}{dt}$$

such that it is ultimately summed with the output from 806 (instead of subtracting from the output of 806). Signal $$-\frac{dV_{TMNOM}}{dt}$$

is scaled by the capacitance value of component(s) $C_2$ in block 814. Scaled signals from blocks 806 and 814 are added with a summing operational amplifier 816, producing summed voltage signal $V_{I1M}$, which can be input into a peak detector and/or analog-to-digital converter (ADC) for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems").

Figure 8B:
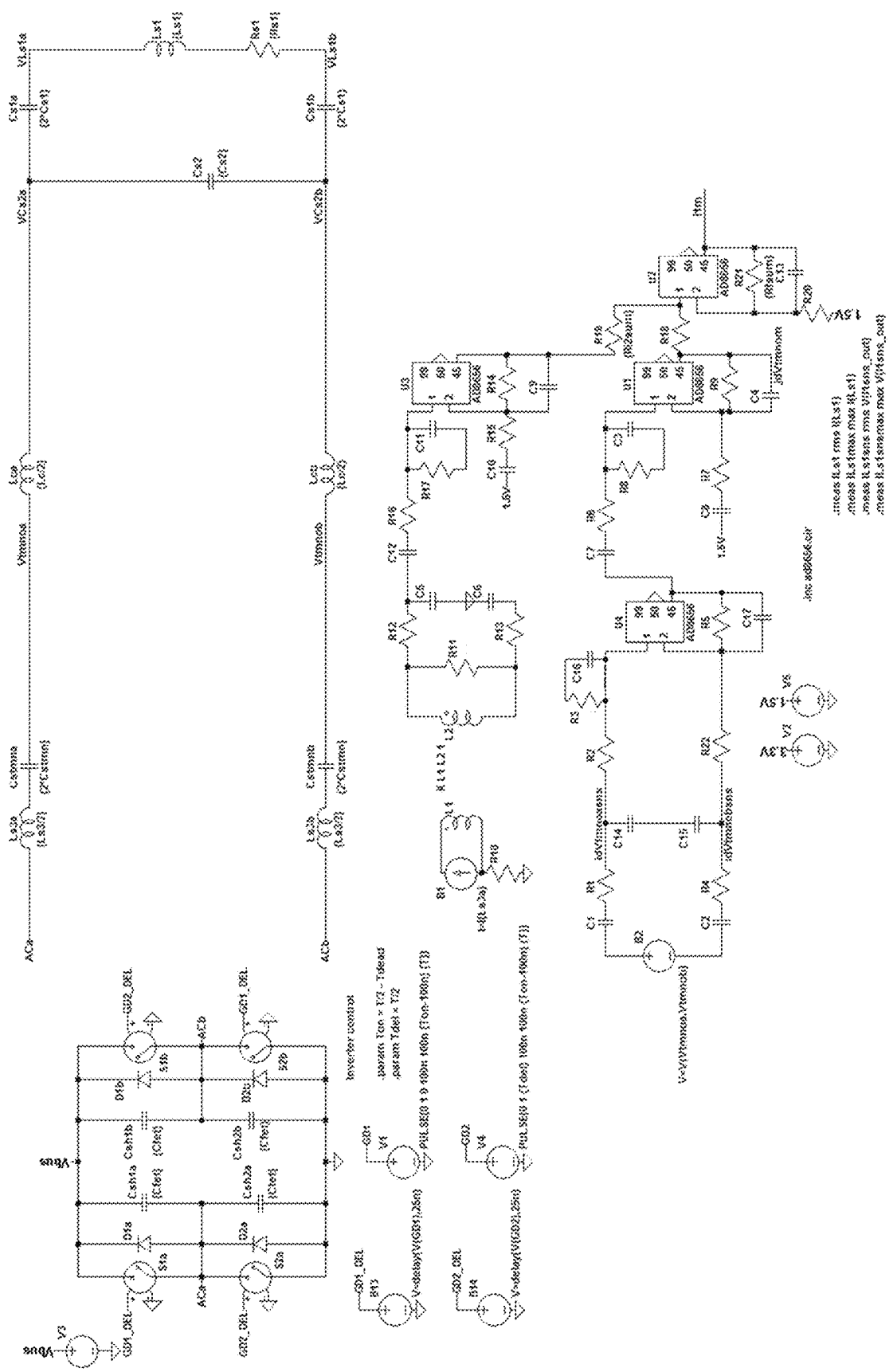
FIG. 8B is a schematic diagram of the sixth exemplary system of FIG. 8A for determining coil current $I_1$.

FIG. 8B is a schematic diagram of the sixth exemplary system 800 for determining coil current $I_1$. The diagrams of FIGS. 8A-8B illustrate that the system 800 can determine coil current $I_{1M}$ without a direct measurement at the transmitter resonator coil $L_1$. In other words, the system 800 can use as inputs current $I_3$ and output voltage $V_{TMNO}$ to ultimately determine coil current $I_1$.

FIG. 8C is a graph 818 of current sense root-mean-square (RMS) error (in amperes A) as a function of cable inductance (in henries H). FIG. 8D is a graph 820 of current sense peak error (A) as a function of cable inductance (H). Specifically, the graphs 818 and 820 illustrate the improved performance of the system and/or method 800 (vertical striped bars with black outline) in comparison with the control system and/or method 200 (solid black bars), as described above, in determining coil current $I_1$. Notably, in system and/or method 800, the current sense RMS error of graph 818 is reduced to less than 0.3 A as compared to the control system and/or method 200 over the range of cable inductances $1 \times 10^{-7}$ H–$5 \times 10^{-6}$ H.

Seventh Embodiment

A seventh exemplary embodiment of a system and/or method for determining coil current $I_1$ can use following derivation:

$$I_{1M} = I_{3M} - I_{2M} \tag{7.1}$$

$$I_{1M} = I_{3M} - C_2 \frac{dV_{2M}}{dt} \tag{7.2}$$

$$I_{1M} = I_{3M} - C_2 \frac{d(V_{TMNO_M} - V_{C_M})}{dt} \tag{7.3}$$

$$I_{1M} = I_{3M} - C_2 \frac{d\left(V_{TMNO_M} - L_C \frac{dI_{3M}}{dt}\right)}{dt} \tag{7.4}$$

$$I_{1M} = I_{3M} - \left(C_2 \frac{dV_{TMNO_M}}{dt} - C_2\left[L_C \frac{d\left\{\frac{dI_{3M}}{dt}\right\}}{dt}\right]\right) \tag{7.5}$$

$$I_{1M} = I_{3M} - \left(C_2 \frac{dV_{TMNO_M}}{dt} - C_2[L_C\{-\omega^2 I_{3M}\}]\right) \tag{7.6}$$

$$I_{1M} = I_{3M} - \left(C_2\left[-\omega^2 \int V_{TMNO_M} dt\right] + L_C C_2 \omega^2 I_{3M}\right) \tag{7.7}$$

$$I_{1M} = I_{3M}(1 - L_C C_2 \omega^2) + C_2 \omega^2 \int V_{TMNO_M} dt \tag{7.8}$$

Figure 9A:
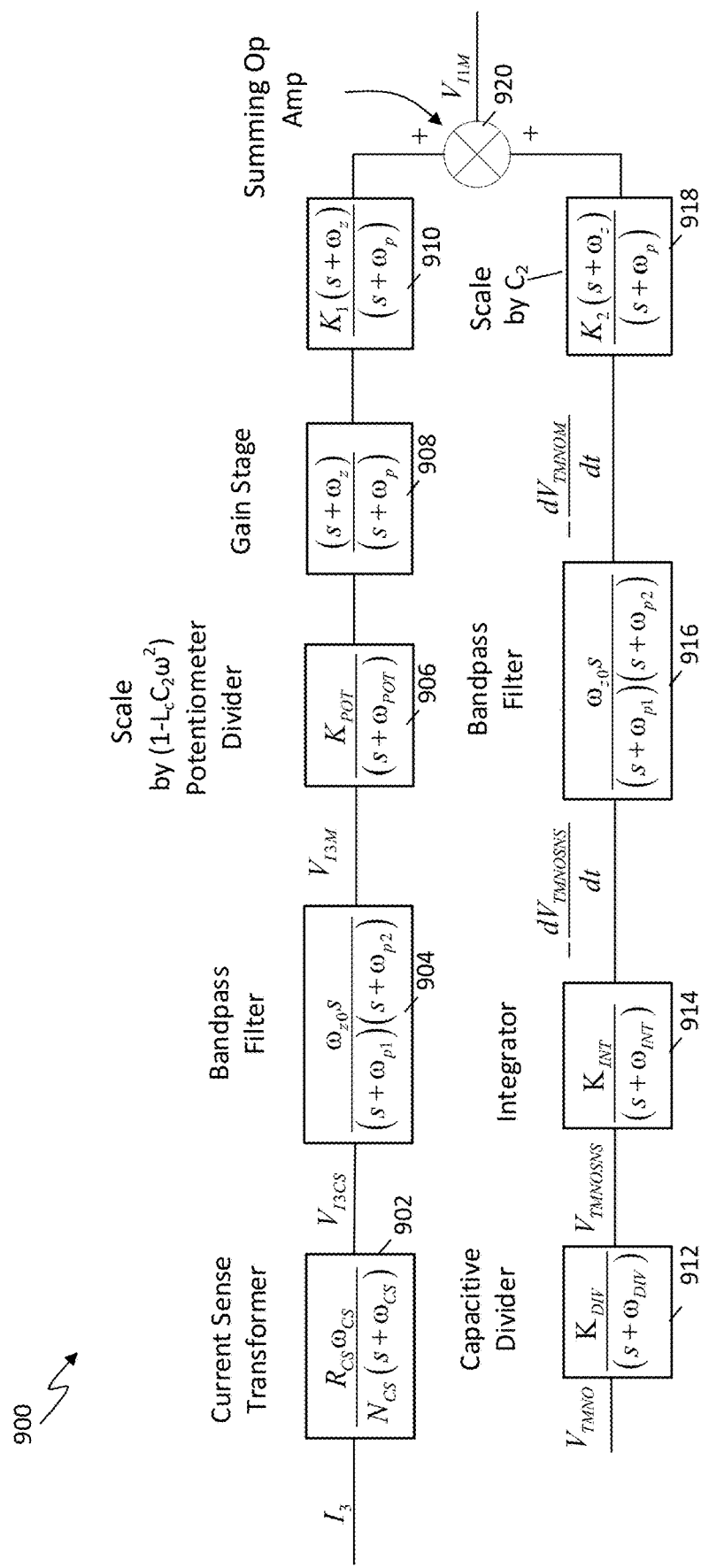
FIG. 9A is a block diagram of a seventh exemplary system and/or method for determining coil current $I_1$.

FIG. 9A is a block diagram of a seventh exemplary system and/or method for determining coil current $I_1$. The exemplary system and/or method 900 implements the above-derived step 7.8 with electronic signals and/or components (e.g., in hardware and/or software). Specifically, in the upper branch, a current sense transformer 902 receives current $I_3$ and produces an output voltage $V_{I3CS}$ proportional to current $I_3$. This voltage signal $V_{I3CS}$ is then filtered in bandpass filter 904 to produce a voltage signal $V_{I3M}$ having the fundamental frequency component of voltage signal $V_{I3CS}$. Voltage signal $V_{I3M}$ is scaled by $(1-L_C C_2 \omega^2)$ with an adjusting circuit (e.g., potentiometer divider) 906 and gain stage 908 to account for the length of cable 128. This is feasible because the fundamental component of the voltage drop in the cable $V_{CM}$ is proportional to $-L_C C_2 \omega^2 I_{3M}$ as shown in equations 7.3 to 7.6. The voltage signal next goes to block 910 to be scaled for the total gain from $$\left(I_3 + C_2 \frac{dV_C}{dt}\right)$$

to the upper positive input of the summing block 920 to match the total gain from $$-C_2 \frac{dV_{TMNO}}{dt}$$

up to the lower positive input of the summing block 920. This is a beneficial step in that the inputs to the summing block 920 are analog scaled representations of the terms in equation 7.8 and if the total gain from $$\left(I_3 + C_2 \frac{dV_C}{dt}\right)$$

to the upper input of summing block 920 does not match the total gain from $$-C_2 \frac{dV_{TMNO}}{dt}$$

to the lower input of the summing block 920, then the summed output will not effectively represent the sum in equation 7.8.

In the lower branch, a voltage divider 912 receives output voltage $V_{TMNO}$ to produce divided voltage signal $V_{TMNOSNS}$. Integrator block 914 receives signal $V_{TMNOSNS}$ and produces negative differentiated signal $$-\frac{dV_{TMNOSNS}}{dt}.$$

Voltage signal $$-\frac{dV_{TMNOSNS}}{dt}$$

is filtered in bandpass filter 916 to produce a voltage signal $$-\frac{dV_{TMNOM}}{dt}$$

having the fundamental frequency component of $$-\frac{dV_{TMNOSNS}}{dt}.$$

By integrating voltage signal $V_{TMNO}$ (instead of differentiating), the discontinuous step components in $V_{TMNO}$ from the inductive voltage drop across the cable $V_C$ are further attenuated. Integrating the voltage signal $V_{TMNO}$ also creates an inverted differentiated signal $$-\frac{dV_{TMNOSNS}}{dt}$$

such that it is ultimately summed with the output from 910 (instead of subtracting from the output of 910). Signal $$-\frac{dV_{TMNOM}}{dt}$$

is scaled by the capacitance value of component(s) $C_2$ in block 918. Scaled signals from blocks 910 and 918 are added with a summing operational amplifier 920, producing summed voltage signal $V_{I1M}$.

Voltage signal $V_{I1M}$ can be input into a peak detector and/or analog-to-digital converter (ADC) for a microcontroller to use as an input for algorithms and fault detection mechanisms. The current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems").

Figure 9B:
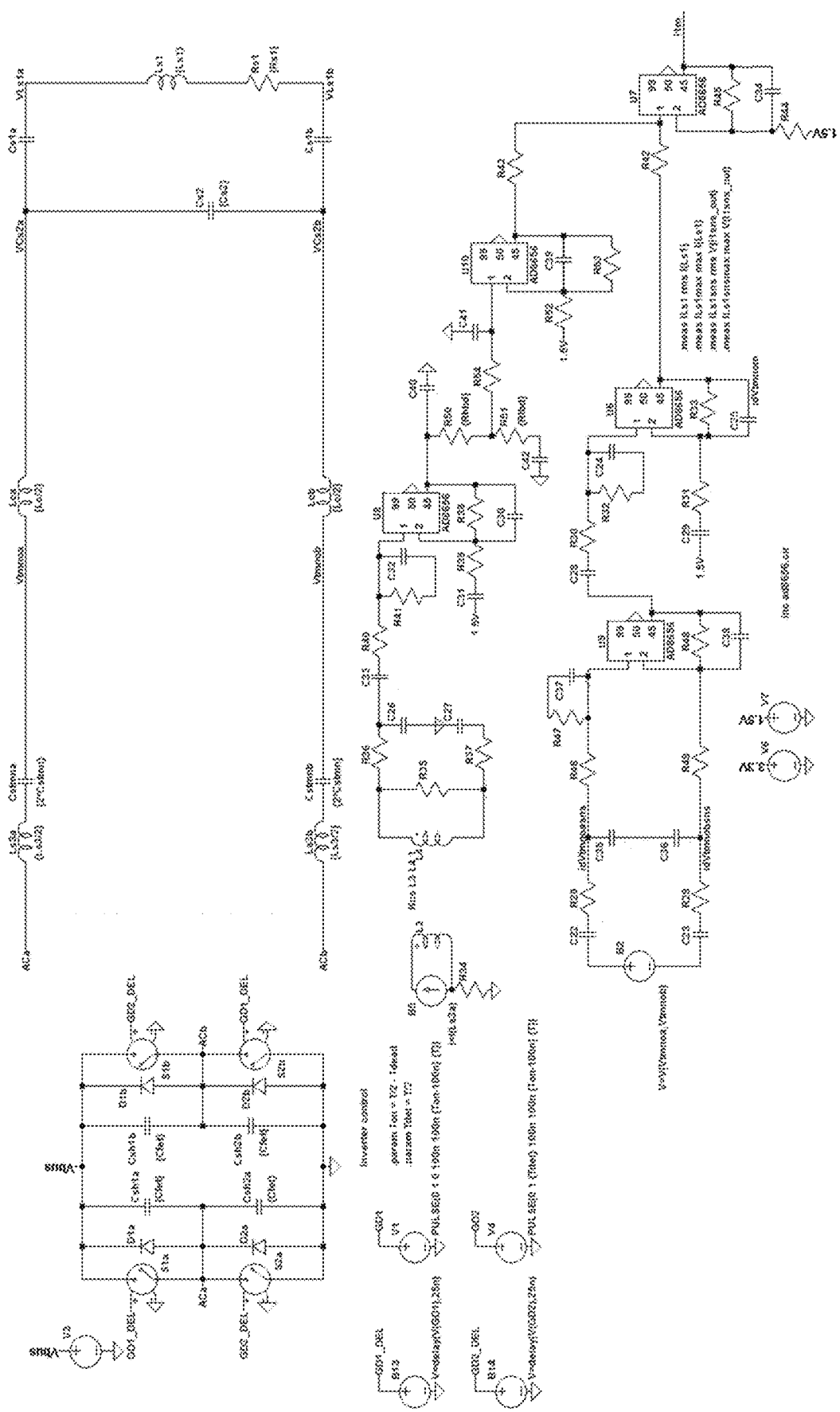
FIGS. 9B-9C are schematic diagrams of the seventh exemplary system of FIG. 9A for determining coil current $I_1$.
Figure 9C:
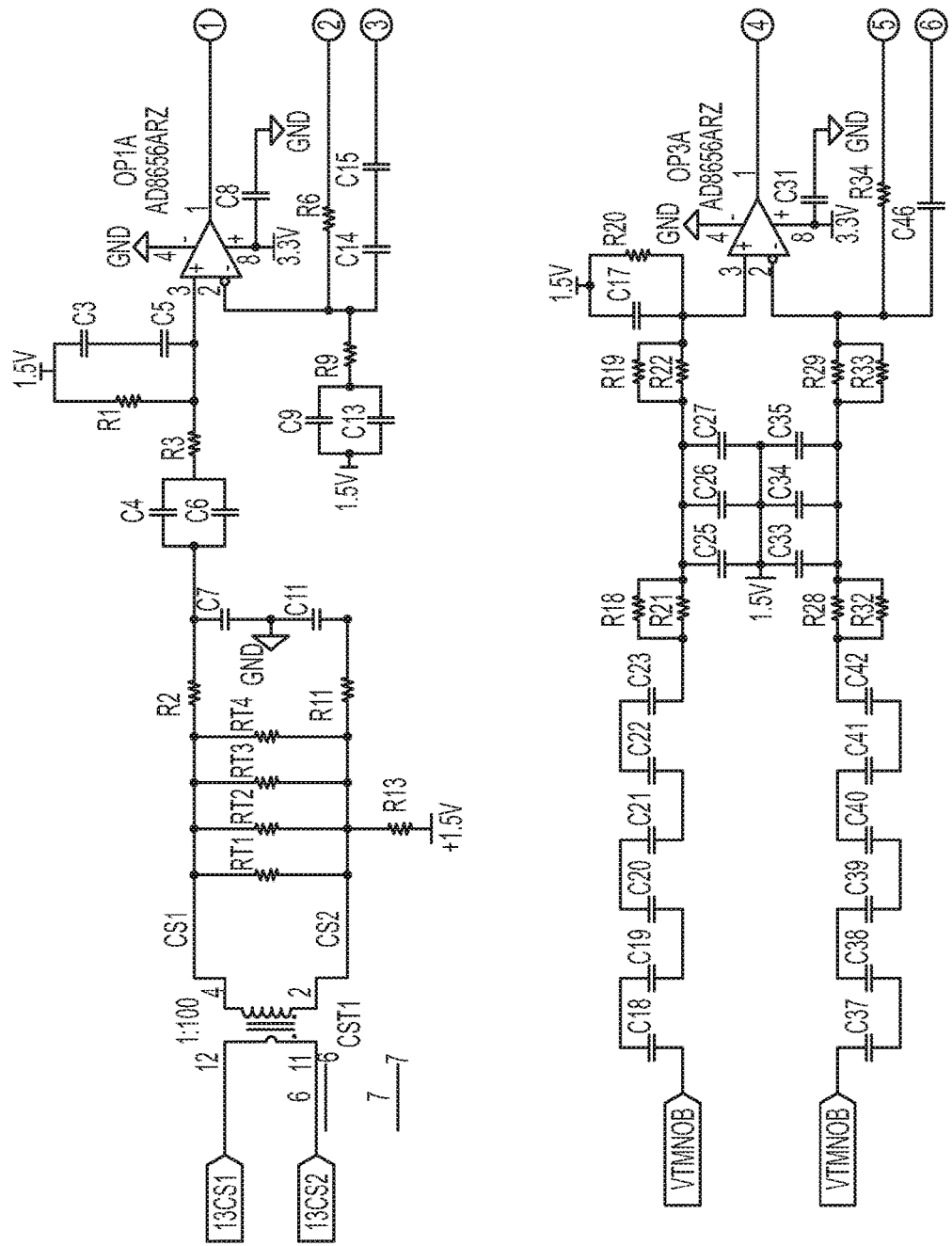
Figure 9C:
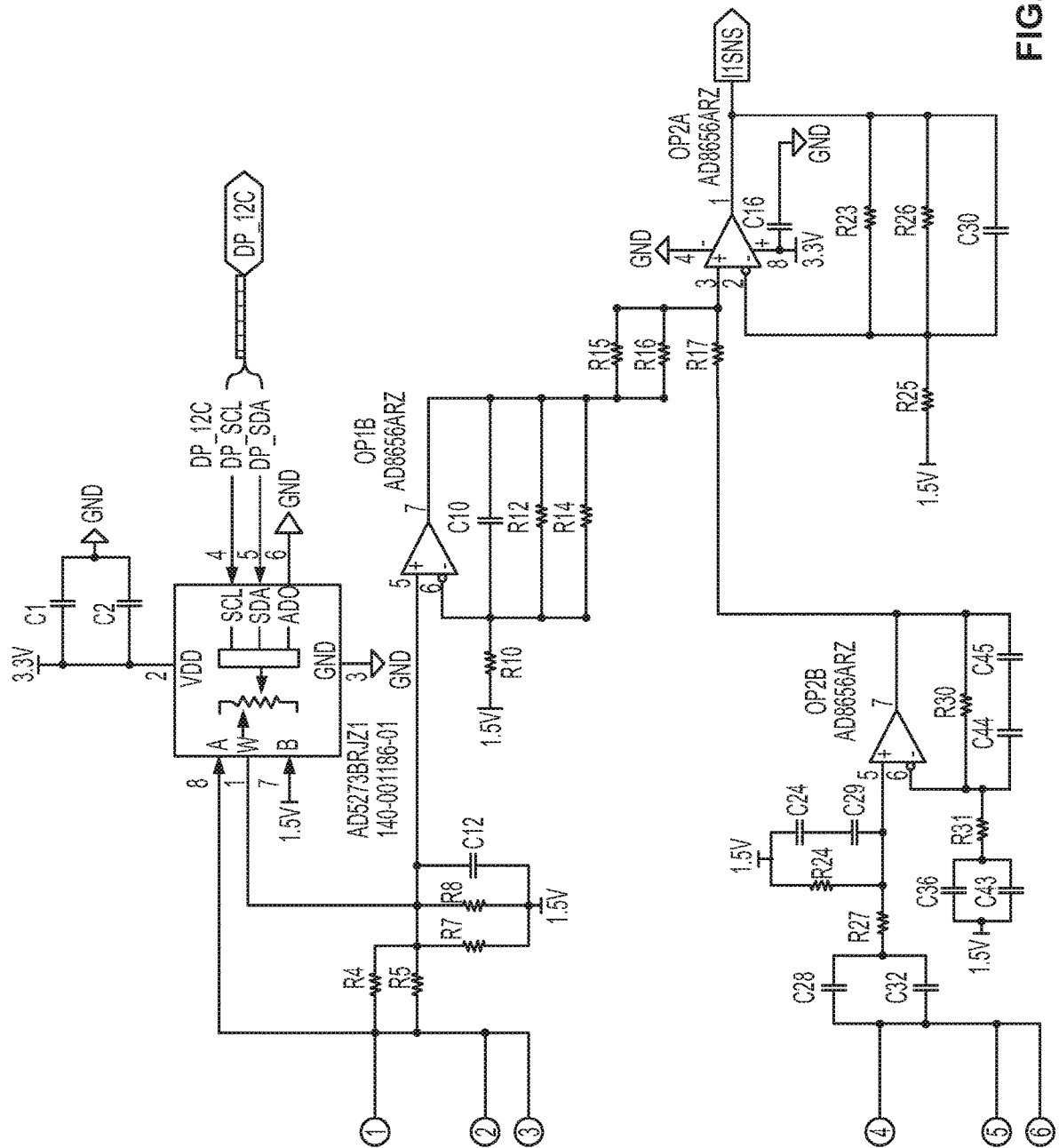

FIGS. 9B-9C are schematic diagrams of the seventh exemplary system 900 for determining coil current $I_1$. The diagrams of FIGS. 9A-9B illustrate that the system 900 can determine coil current $I_{1M}$ without a direct measurement at the transmitter resonator coil $L_1$. In other words, the system 900 can use as inputs current $I_3$ and output voltage $V_{TMNO}$ to ultimately determine coil current $I_1$.

Figures 9D, 9E:
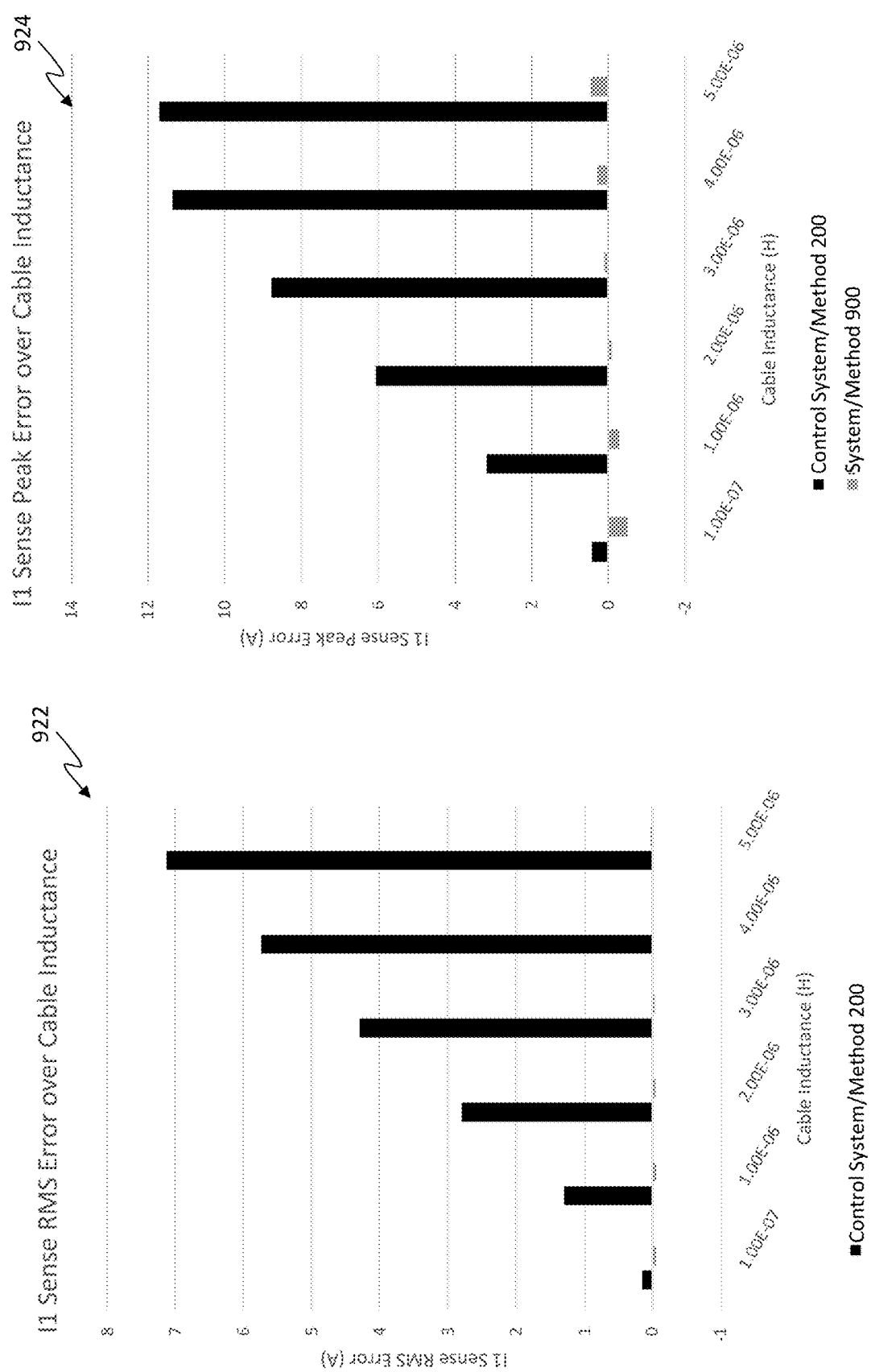
FIG. 9D is a graph of current sense root-mean-square (RMS) error (in amperes A) as a function of cable inductance (H).
FIG. 9E is a graph of current sense peak error (A) as a function of cable inductance (H).

FIG. 9D is a graph 922 of current sense root-mean-square (RMS) error (in amperes A) as a function of cable inductance (in henries H). FIG. 9E is a graph 924 of current sense peak error (A) as a function of cable inductance (H). Specifically, the graphs 922 and 924 illustrate the improved performance of the system and/or method 900 (light gray bars) in comparison with the control system and/or method 200 (solid black bars), as described above, in determining coil current $I_1$. Notably, in system and/or method 900, the current sense RMS error of graph 922 is reduced to less than 0.1 A as compared to the control system and/or method 200 over the range of cable inductances $1 \times 10^{-7}$ $^H-5 \times 10^{-6}$ H.

Figure 9F:
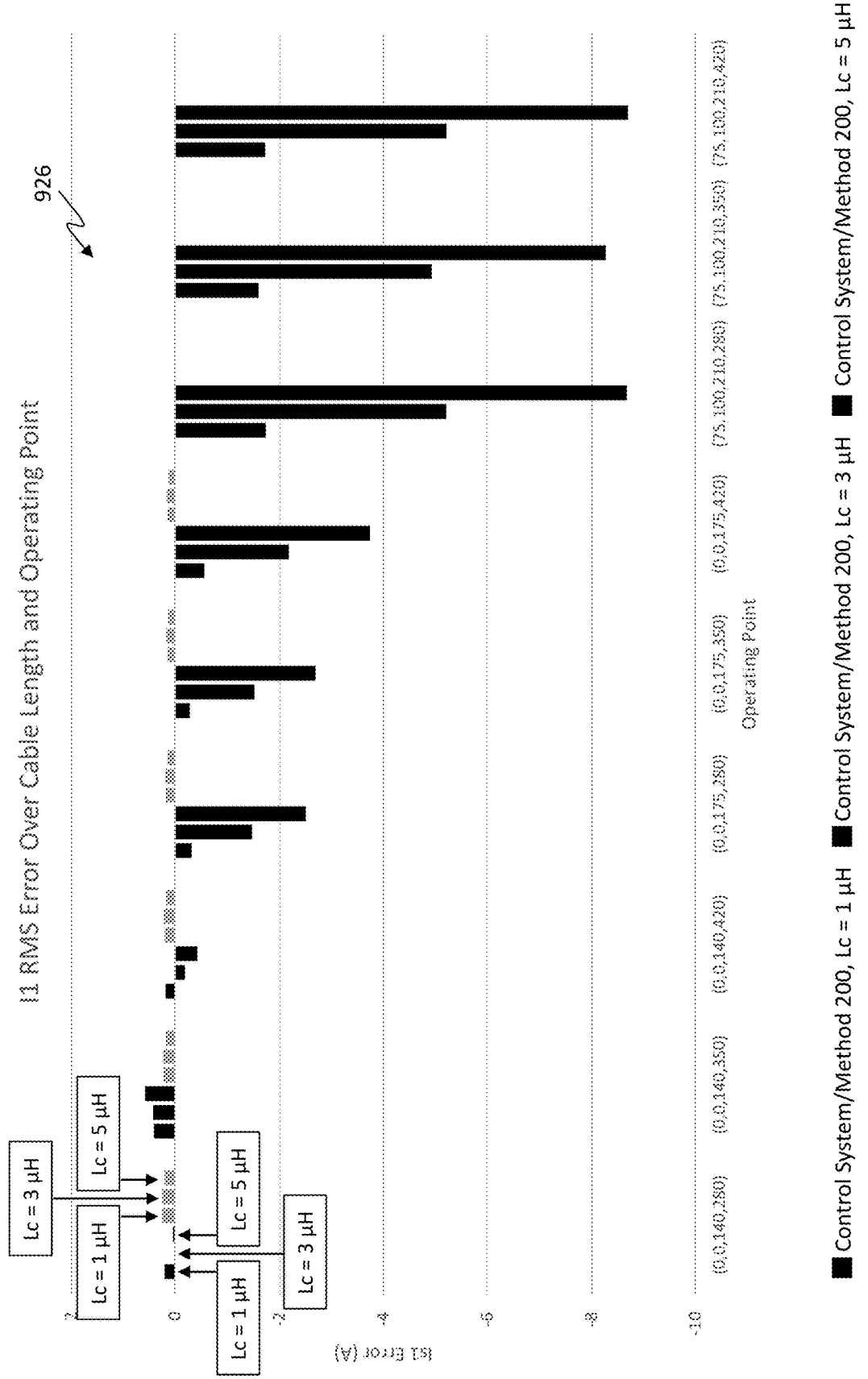
FIG. 9F is a graph of current sense root-mean-square (RMS) error (in amperes A) as a function of cable inductance (H) and operating point.
Figure 9G:
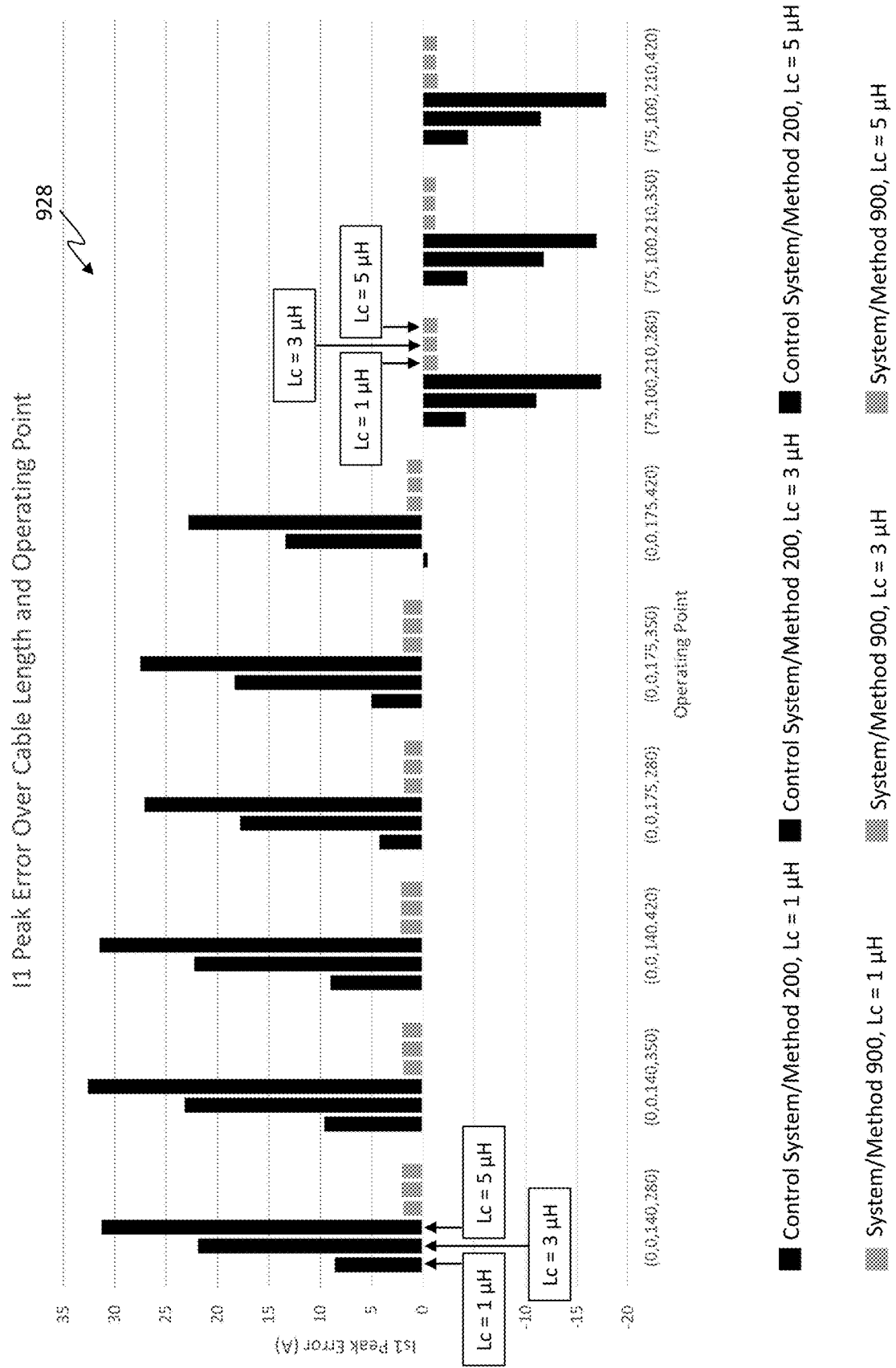
FIG. 9G is a graph of current sense peak error (A) as a function of cable inductance (H) and operating point.
Figure 9H:
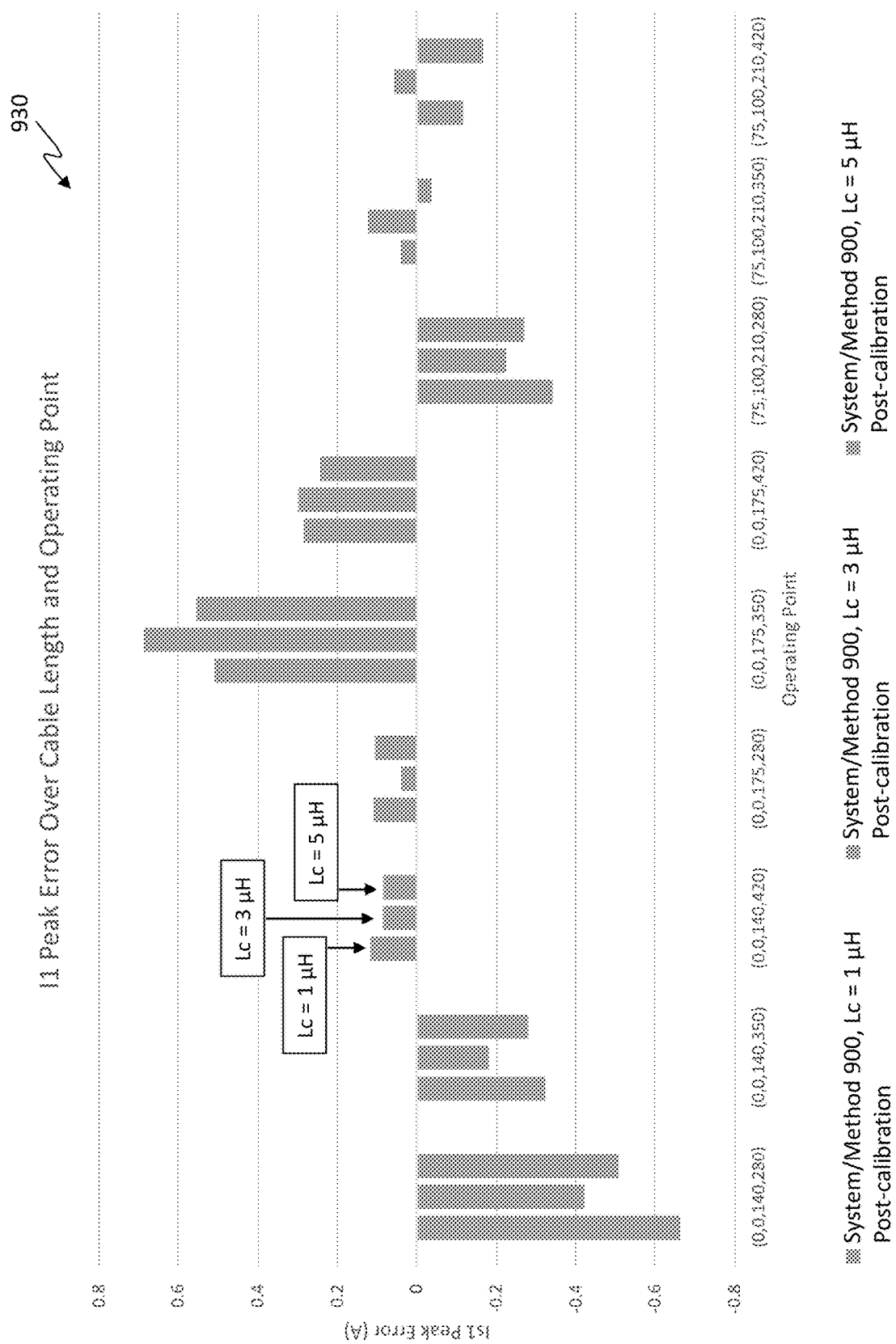
FIG. 9H is a graph of current sense peak error (in amperes A) as a function of cable inductance (H) and operating point post-calibration.

FIG. 9F is a graph 926 of current sense root-mean-square (RMS) error (in amperes A) as a function of cable inductances $L_C$=1 µH, 3 µH, and 5 µH, respectively, and operating point. FIG. 9G is a graph 928 of current sense peak error (A) as a function of cable inductances $L_C$=1 µH, 3 µH, and 5 µH, respectively, and operating point. FIG. 9H is a graph 930 of current sense peak error (in amperes A) as a function of cable inductances $L_C$=1 µH, 3 µH, and 5 µH, respectively, and operating point post-calibration. The operating points of the x-axis of FIGS. 9F-9H are represented as tuples with elements x-offset, y-offset, z-offset, and battery voltage (e.g., (0, 0, 140, 280)). The x-offset, y-offset, and z-offset refer to positioning of a receiver resonator coil 132 relative to the transmitter resonator coil 130 (refer to FIG. 1C and related description above). From left to right, the operating points include: (0, 0, 140, 280); (0, 0, 140, 350); (0, 0, 140, 420); (0, 0, 175, 280); (0, 0, 175, 350); (0, 0, 175, 420); (75, 100, 210, 280); (75, 100, 210, 350); and (75, 100, 210, 420).

The calibration process used to create FIG. 9H involves applying a first-order polynomial curve fit on the coil current determination system output as a function of actual coil current, then inputting the coil current determination system output into the equation from the curve fitting process to create an output that has the reduced error displayed in FIG. 9H (as compared to the non-calibrated error for the same system and/or method 900 provided in FIGS. 9F-9G). A microcontroller can apply a similar curve fit equation to the coil current determination system output to get a reduced error as displayed in FIG. 9H. In some embodiments, calibration can be beneficial in removing errors associated with cable inductance $L_C$. In some embodiments, calibration can be beneficial in removing sensor errors and/or amplifier errors (e.g., offset, non-linearity errors, etc).

As FIG. 9F illustrates, as the operating point progresses from less offset (e.g., (0, 0, 140, 280) to greater offset (e.g., (0, 0, 175, 280) or (75, 100, 210, 280)) in the x, y, and z axes, there is a significant increase in absolute value of RMS error of coil current $I_1$ for the control system and/or method 200. By contrast, the absolute value of the current $I_1$ RMS error for the system and/or method 900 is steady or decreasing with increase in offset. Moreover, the error for the system and/or method 900 is much lower than that of the control system and/or method 200 for most operating points.

FIG. 9G illustrates that the absolute value of the error for system and/or method 900 is lower (e.g., less than 3 A) for most operating points as compared to control system and/or method 200 (e.g., greater than 4 A).

Eighth Embodiment

An eighth exemplary embodiment of a system and/or method for determining coil current $I_1$ can use following derivation:

$$I_{1_M} = I_{3_M} - I_{2_M} \tag{8.1}$$

$$I_{1_M} = I_{3_M} - C_2 \frac{dV_{2_M}}{dt} \tag{8.2}$$

-continued $$I_{1_M} = I_{3_M} - C_2 \frac{d(V_{TMNO_M} - V_{C_M})}{dt} \quad (8.3)$$

$$I_{1_M} = I_{3_M} - C_2 \frac{d\left(V_{TMNO_M} - L_C \frac{dI_{3_M}}{dt}\right)}{dt} \quad (8.4)$$

$$I_{1_M} = I_{3_M} - \left(C_2 \frac{dV_{TMNO_M}}{dt} - C_2\left[L_C \frac{d\left\{\frac{dI_{3_M}}{dt}\right\}}{dt}\right]\right) \quad (8.5)$$

$$I_{1_M} = I_{3_M} - \left(C_2 \frac{dV_{TMNO_M}}{dt} - C_2[L_C\{-\omega^2 I_{3_M}\}]\right) \quad (8.6)$$

$$I_{1_M} = I_{3_M} - \left(C_2\left[-\omega^2 \int V_{TMNO_M} dt\right] + L_C C_2 \omega^2 I_{3_M}\right) \quad (8.7)$$

$$I_{1_M} = I_{3_M}(1 - L_C C_2 \omega^2) + C_2 \omega^2 \int V_{TMNO_M} dt \quad (8.8)$$

Figure 10A:
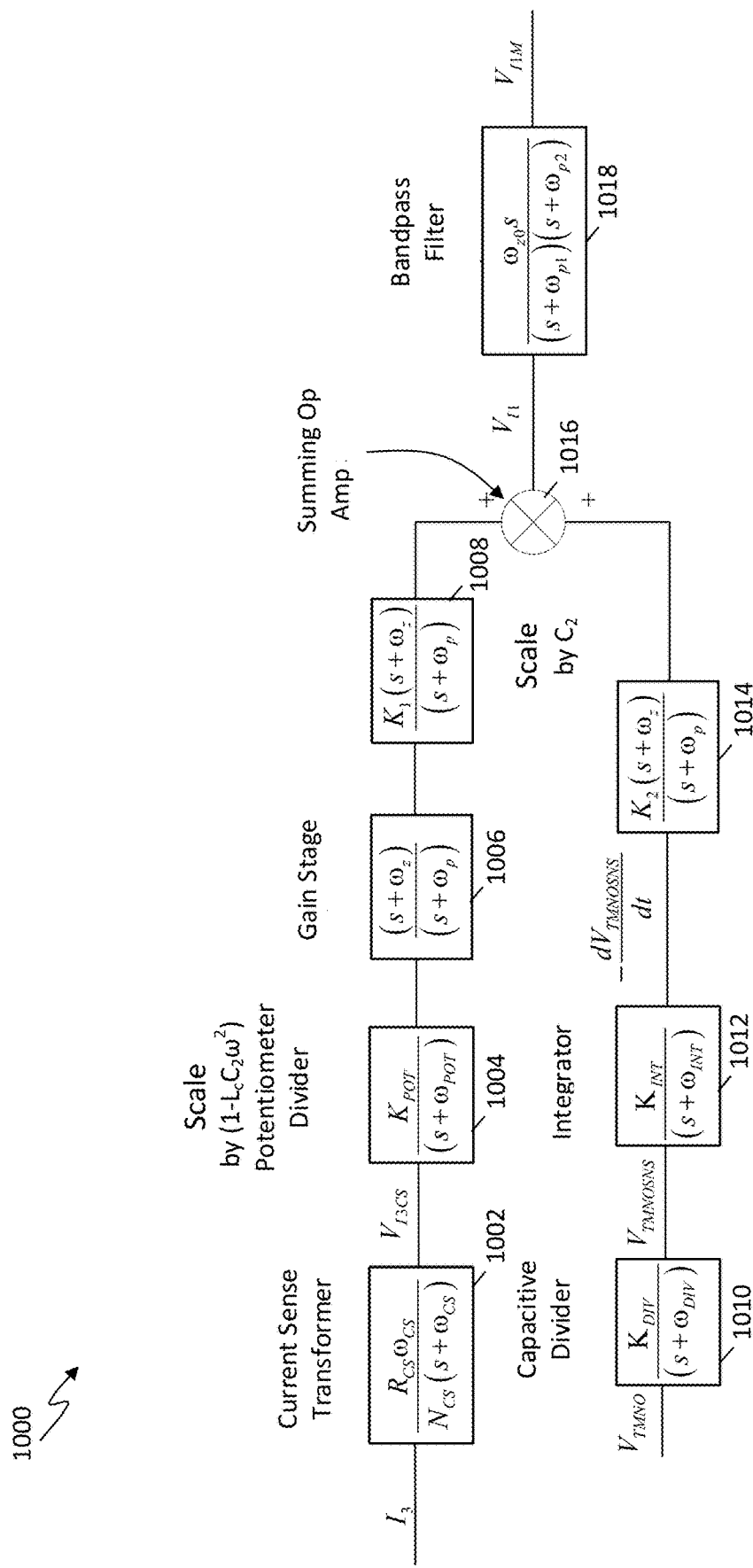
FIG. 10A is a block diagram of an eighth exemplary system and/or method for determining coil current $I_1$.

FIG. 10A is a block diagram of an eighth exemplary system and/or method for determining coil current $I_1$. The exemplary system and/or method 1000 implements the above-derived step 8.8 with electronic signals and/or components (e.g., in hardware and/or software). FIG. 10I is a flowchart of the exemplary method 1000 for determining current $I_1$ in the resonator coil. Specifically, in the upper branch, in determining a first signal in step 1030, a current sense transformer 1002 receives current $I_3$ (in step 1032) and produces an output voltage $V_{I3CS}$ proportional to current $I_3$ (in step 1034). In step 1036, voltage signal $V_{I3CS}$ is scaled by $(1-L_C C_2 \omega^2)$ with an adjusting circuit (e.g., potentiometer divider) 1004 and gain stage 1006 to account for the length of cable 128. This is feasible because the fundamental component of the voltage drop $V_{CM}$ in the cable 128 is proportional to $-L_C C_2 \omega^2 I_{3M}$ as shown in equations 8.3 to 8.6. The scaled signal next goes to block 1008 to be scaled for the total gain from $$\left(I_3 + C_2 \frac{dV_C}{dt}\right)$$

up to the upper positive input of the summing block 1016 to match the total gain from $$-C_2 \frac{dV_{TMNO}}{dt}$$

up to the lower positive input of the summing block 1016. Because the inputs to the summing block 1016 are analog-scaled representations of the terms in equation 8.8 and if the total gain from $$\left(I_3 + C_2 \frac{dV_C}{dt}\right)$$

to the upper input of summing block 1016 do not match the total gain from $$-C_2 \frac{dV_{TMNO}}{dt}$$

to the lower input of the summing block 1016, then the summed output will not effectively represent the sum in equation 8.8.

In the lower branch, in determining the second signal in step 1038, a voltage divider 1010 receives output voltage $V_{TMNO}$ (in step 1040) to produce divided voltage signal $V_{TMNOSNS}$ (in step 1042). In step 1044, integrator block 1012 receives signal $V_{TMNOSNS}$ and produces negative differentiated signal $$-\frac{dV_{TMNOSNS}}{dt}.$$

By integrating voltage signal $V_{TMNO}$ (instead of differentiating), the discontinuous step components in $V_{TMNO}$ from the inductive voltage drop $V_C$ across the cable 128 are further attenuated. Integrating the voltage signal $V_{TMNO}$ also creates an inverted differentiated signal $$-\frac{dV_{TMNOSNS}}{dt}$$

such that it is ultimately summed with the output from 1008 (instead of subtracting from the output of 1008). Signal $$-\frac{dV_{TMNOM}}{dt}$$

is scaled by the capacitance value of component(s) $C_2$ in block 1014. In step 1046, scaled signals from blocks 1008 and 1014 are added with a summing operational amplifier 1016, producing summed voltage signal $V_{I1}$.

Voltage signal $V_{I1}$ is filtered in bandpass filter 1018 to produce a voltage signal $V_{I1M}$ having the fundamental frequency component of voltage signal $V_{I1}$. Voltage signal $V_{I1M}$ can be input into a peak detector and/or analog-to-digital converter (ADC) for a microcontroller to use as an input for algorithms and fault detection mechanisms. In step 1048, the current signal $I_{1M}$ may be determined from voltage signal $V_{I1M}$ (e.g., using one or more of the techniques described above). The current signal $I_{1M}$ may be used in adjusting one or more components of the wireless power system, as described above (see, e.g., section titled "Determining Current in Wireless Power Systems").

Figure 10B:
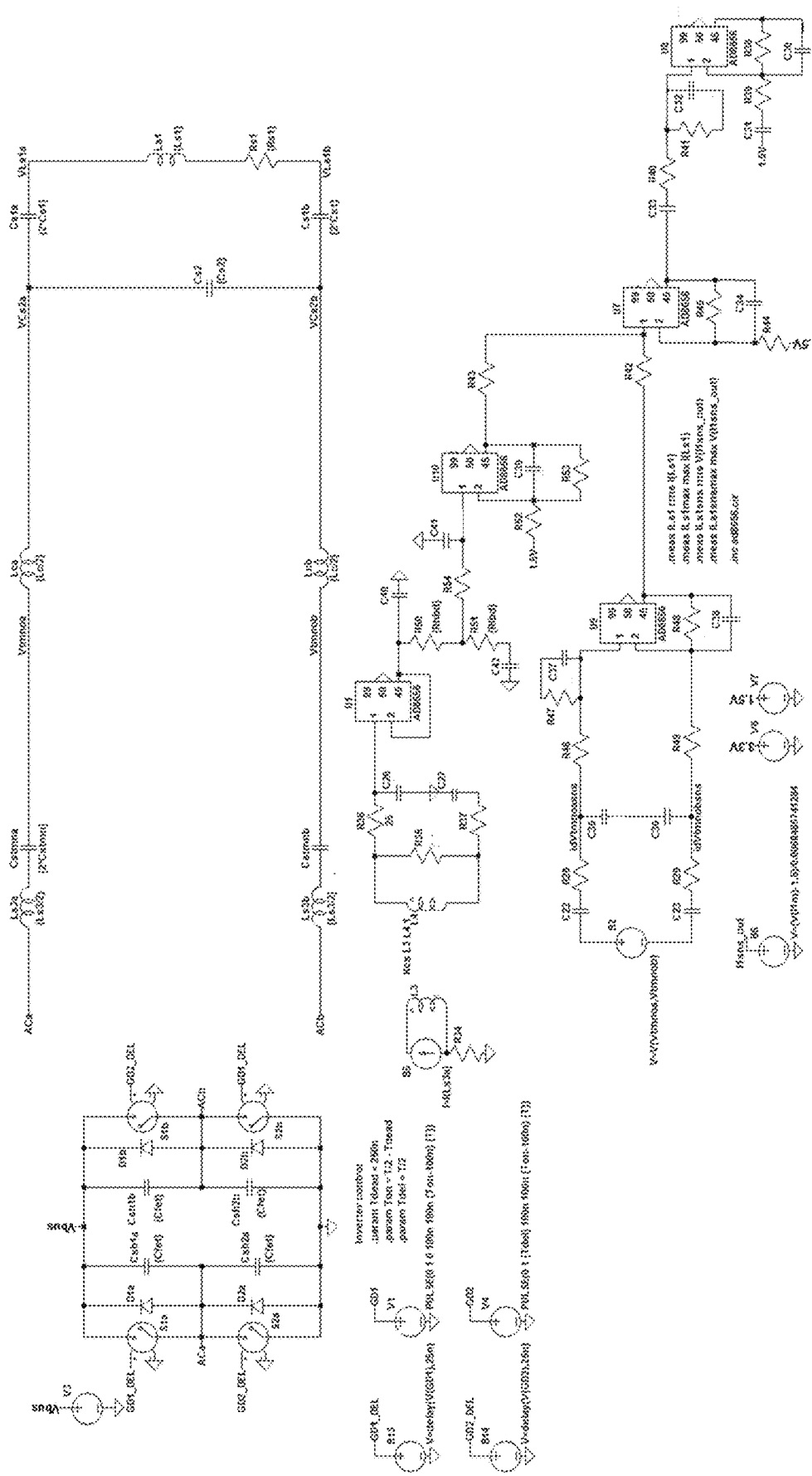
FIGS. 10B-10C are schematic diagrams of the eighth exemplary system for determining coil current $I_1$.
Figure 10C:
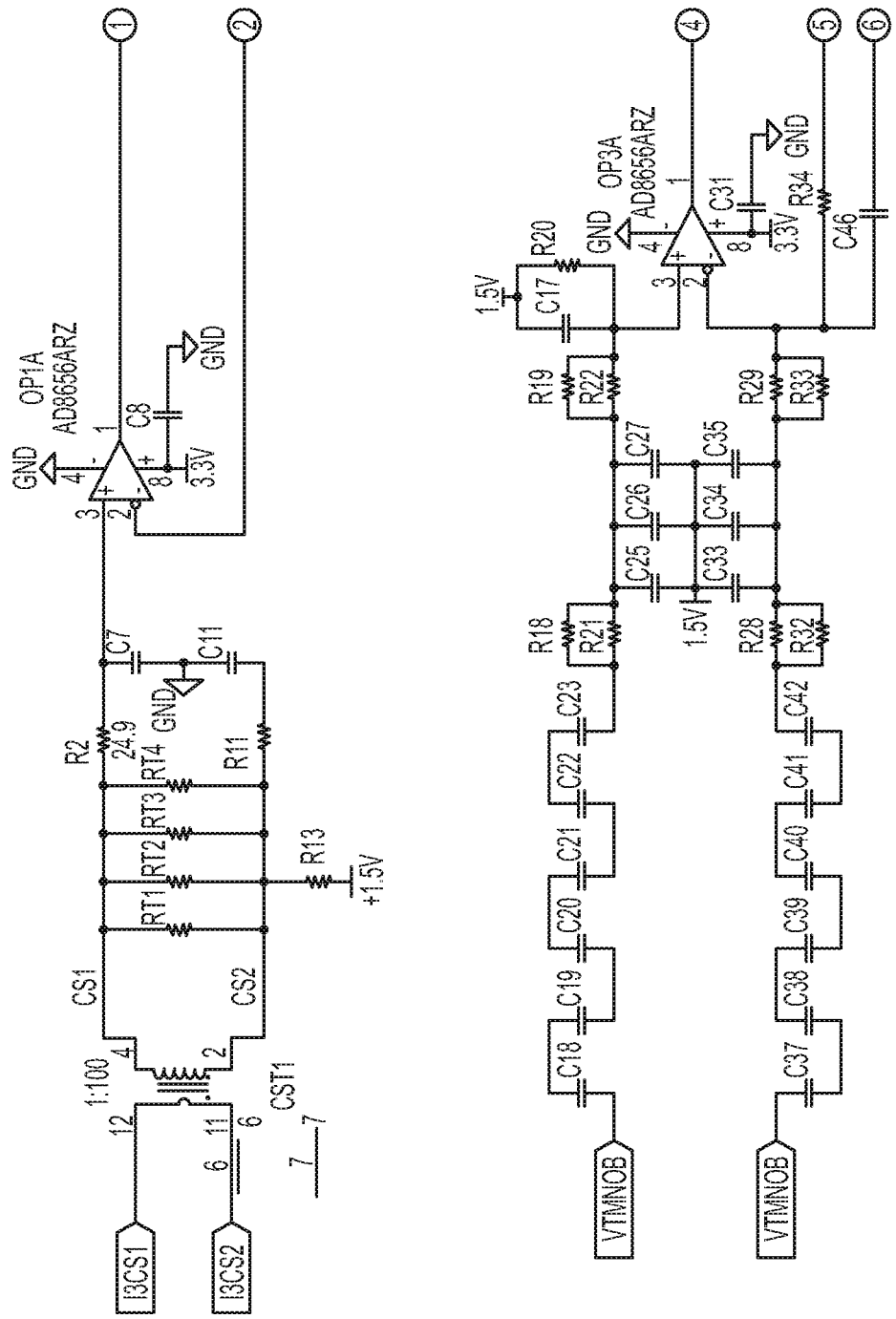
Figure 10C:
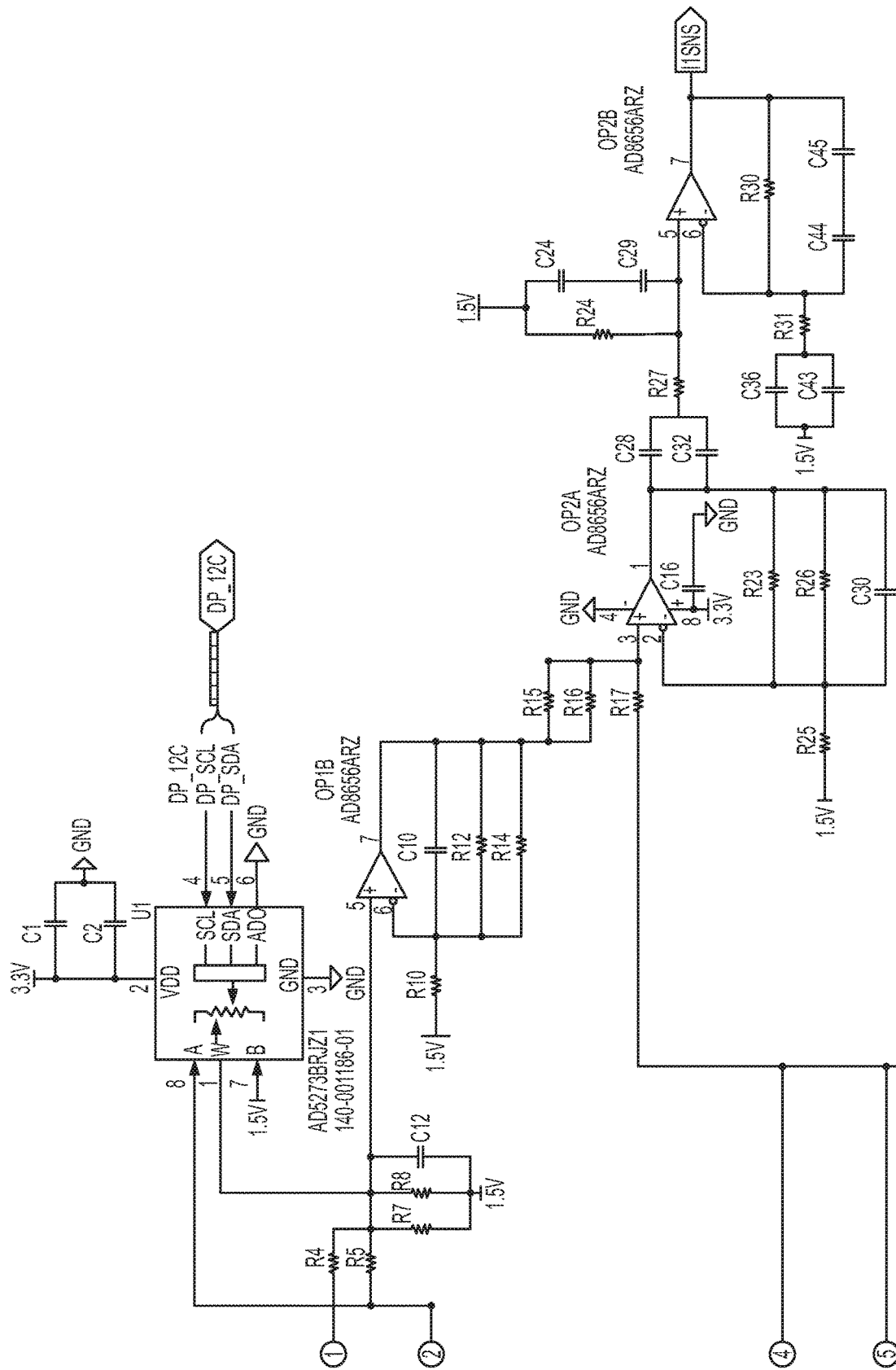

FIGS. 10B-10C are schematic diagrams of the eighth exemplary system for determining coil current $I_1$. The diagrams of FIGS. 10A-10B illustrate that the system 1000 can determine coil current $I_{1M}$ without a direct measurement at the transmitter resonator coil $L_1$. In other words, the system 1000 can use as inputs current $I_3$ and output voltage $V_{TMNO}$ to ultimately determine coil current $I_1$.

Figures 10D, 10E:
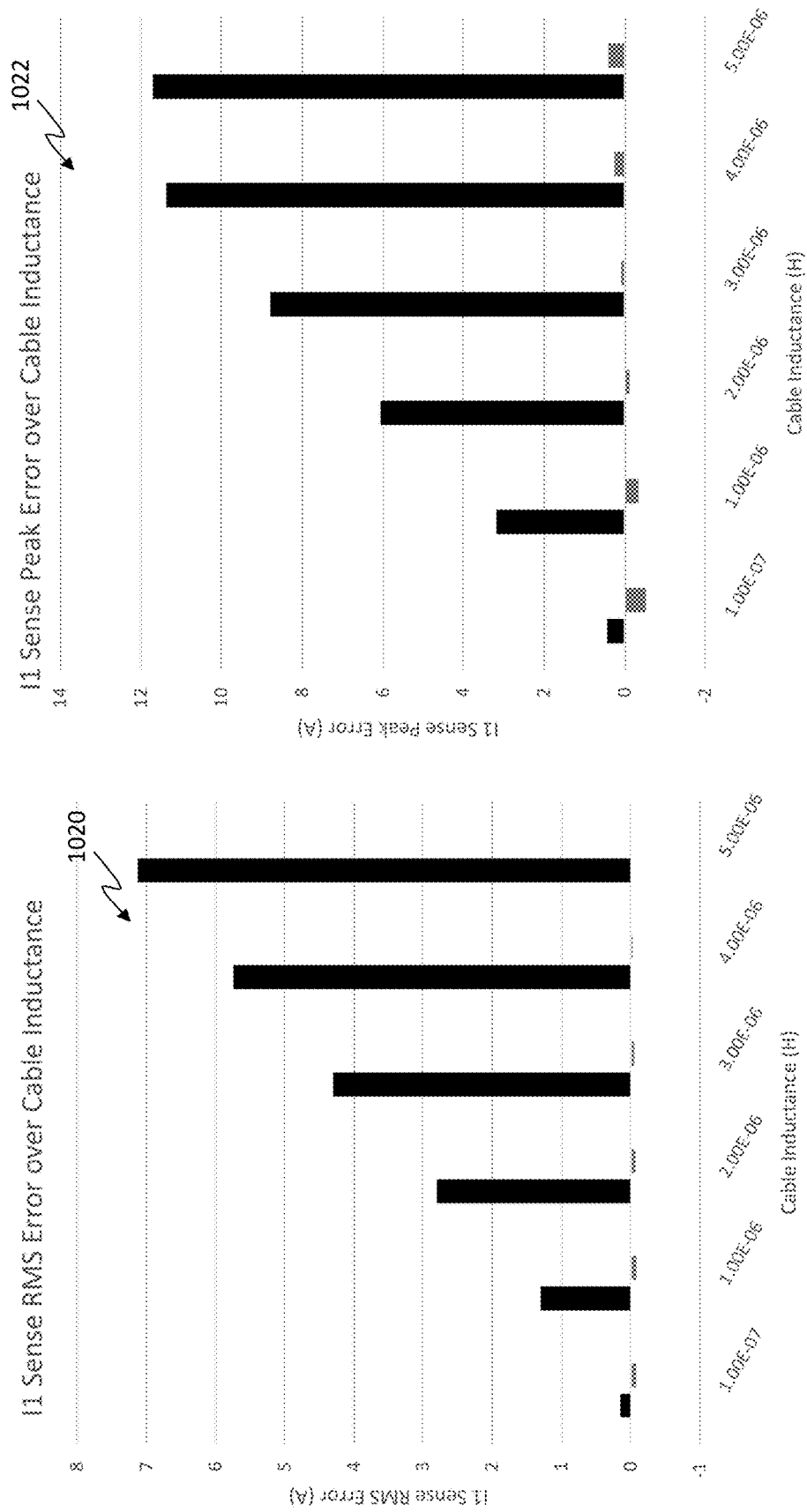
FIG. 10D is a graph of current sense root-mean-square (RMS) error (in amperes A) as a function of cable inductance (H).
FIG. 10E is a graph of current sense peak error (A) as a function of cable inductance (H).

FIG. 10D is a graph 1020 of current sense root-mean-square (RMS) error (in amperes A) as a function of cable inductance (in henries H). FIG. 10E is a graph 1022 of current sense peak error (A) as a function of cable inductance (H). Specifically, the graphs 1020 and 1022 illustrate the improved performance of the system and/or method 1000 (dark gray bars) in comparison with the control system and/or method 200 (solid black bars), as described above, in determining coil current $I_1$. Notably, in system and/or method 1000, the current sense RMS error of graph 1020 is reduced to less than 0.1 A as compared to the control system and/or method 200 over the range of cable inductances $1\times10^{-7}$ $^H$–$5\times10^{-6}$ $^H$.

Figure 10F:
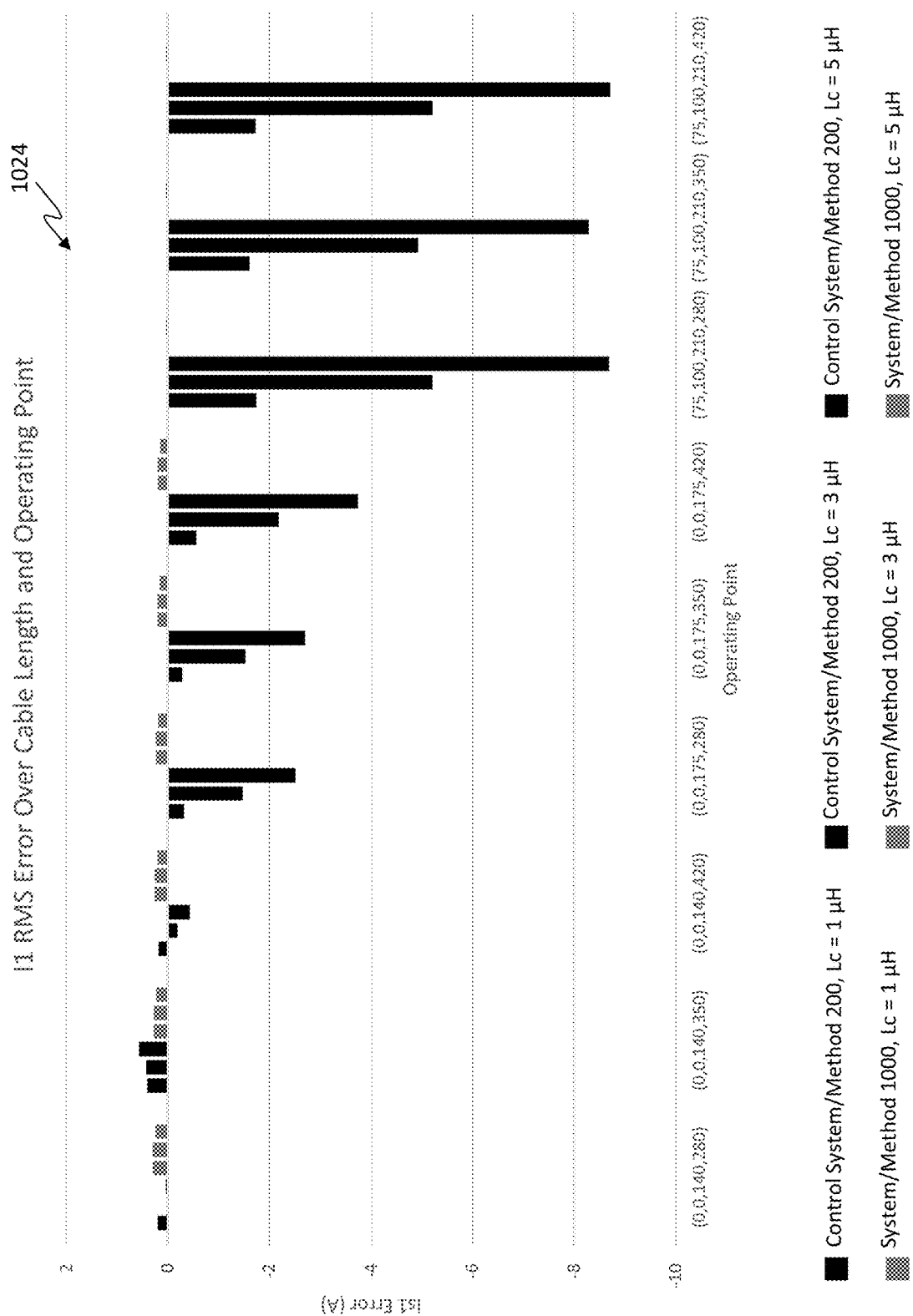
FIG. 10F is a graph of current sense root-mean-square (RMS) error (in amperes A) as a function of cable inductance (H) and operating point.
Figure 10G:
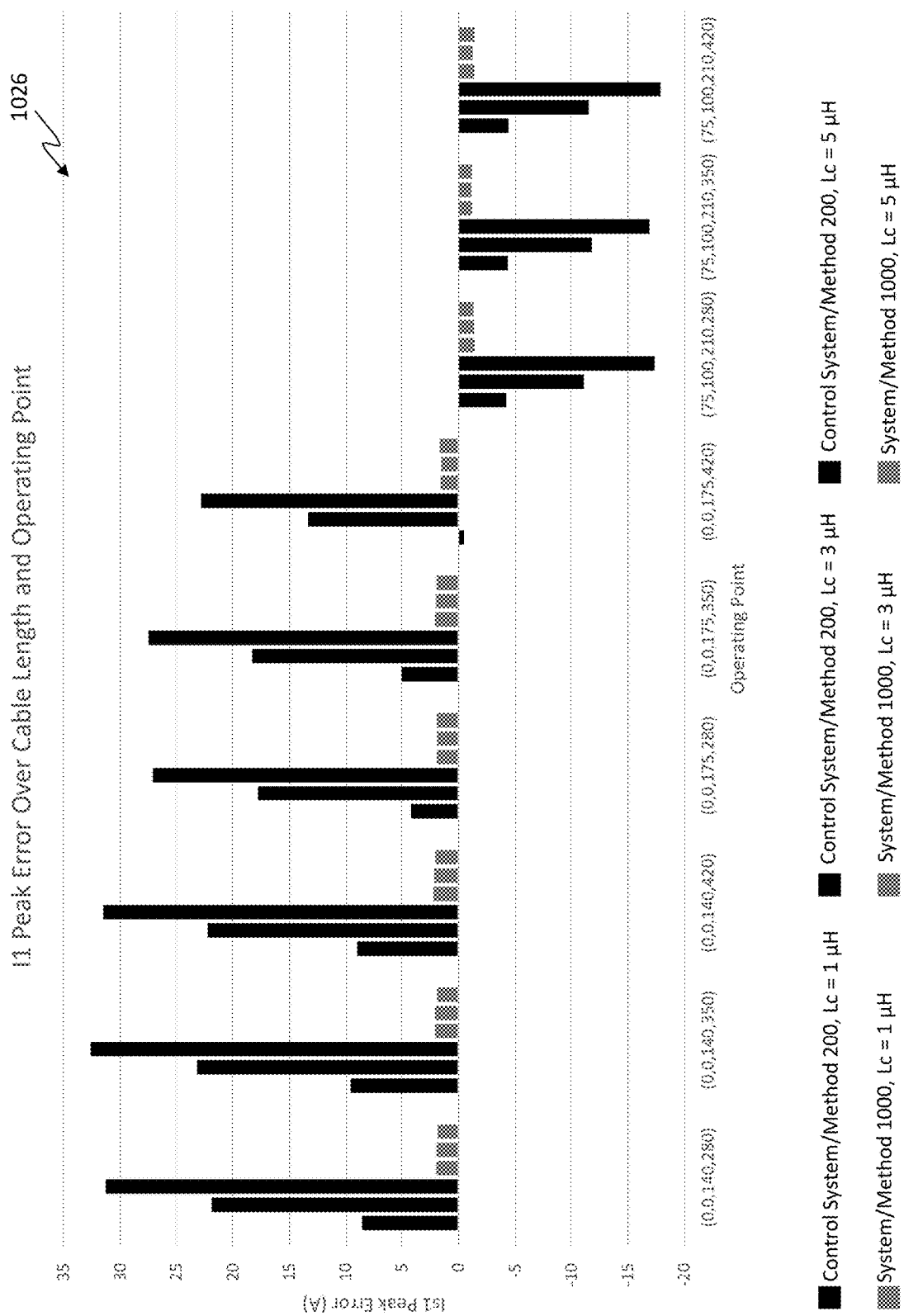
FIG. 10G is a graph of current sense peak error (A) as a function of cable inductance (H) and operating point.
Figure 10H:
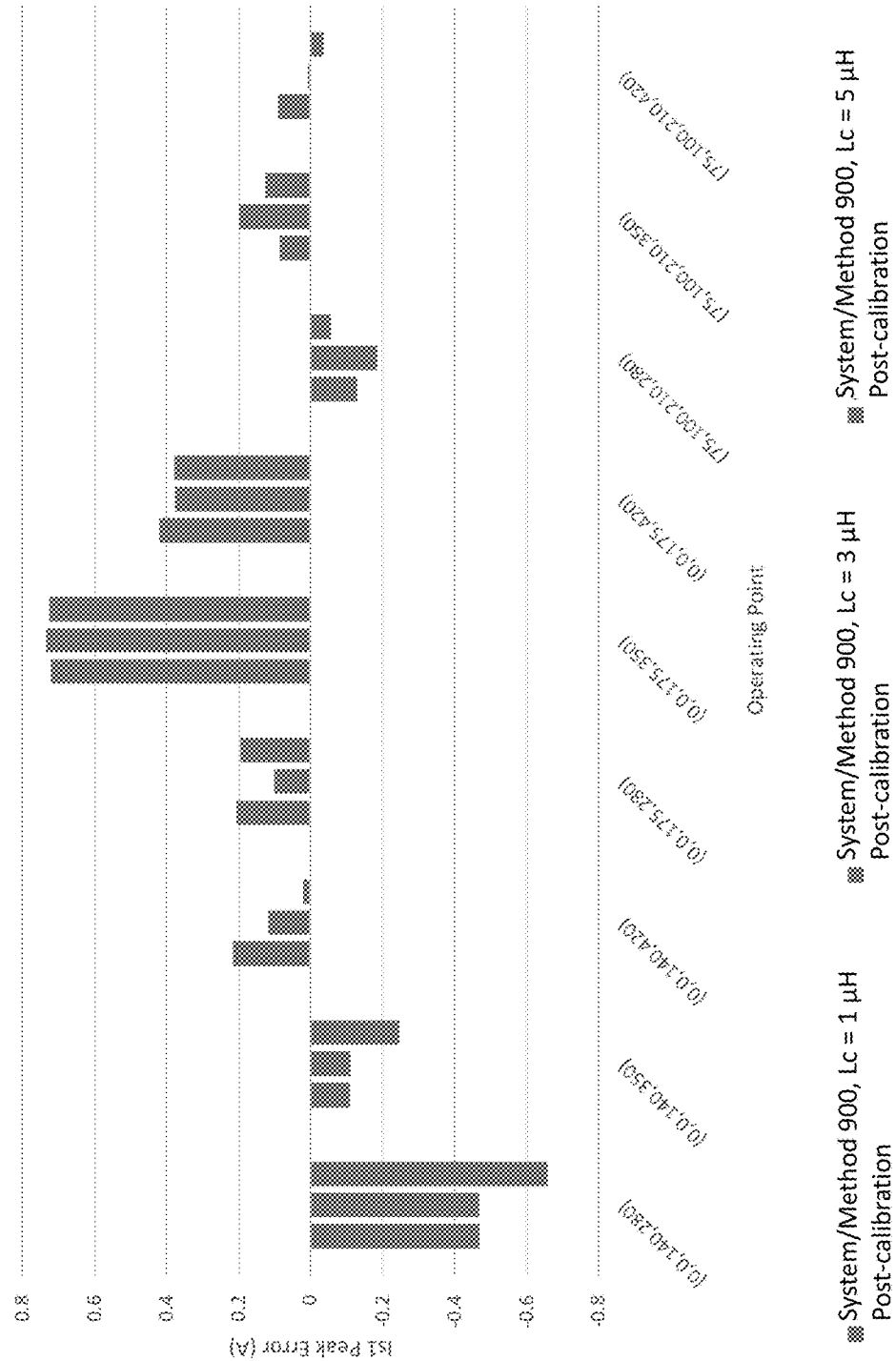
FIG. 10H is a graph of current sense peak error (in amperes A) as a function of cable inductance (H) and operating point post-calibration.
Figure 10I:
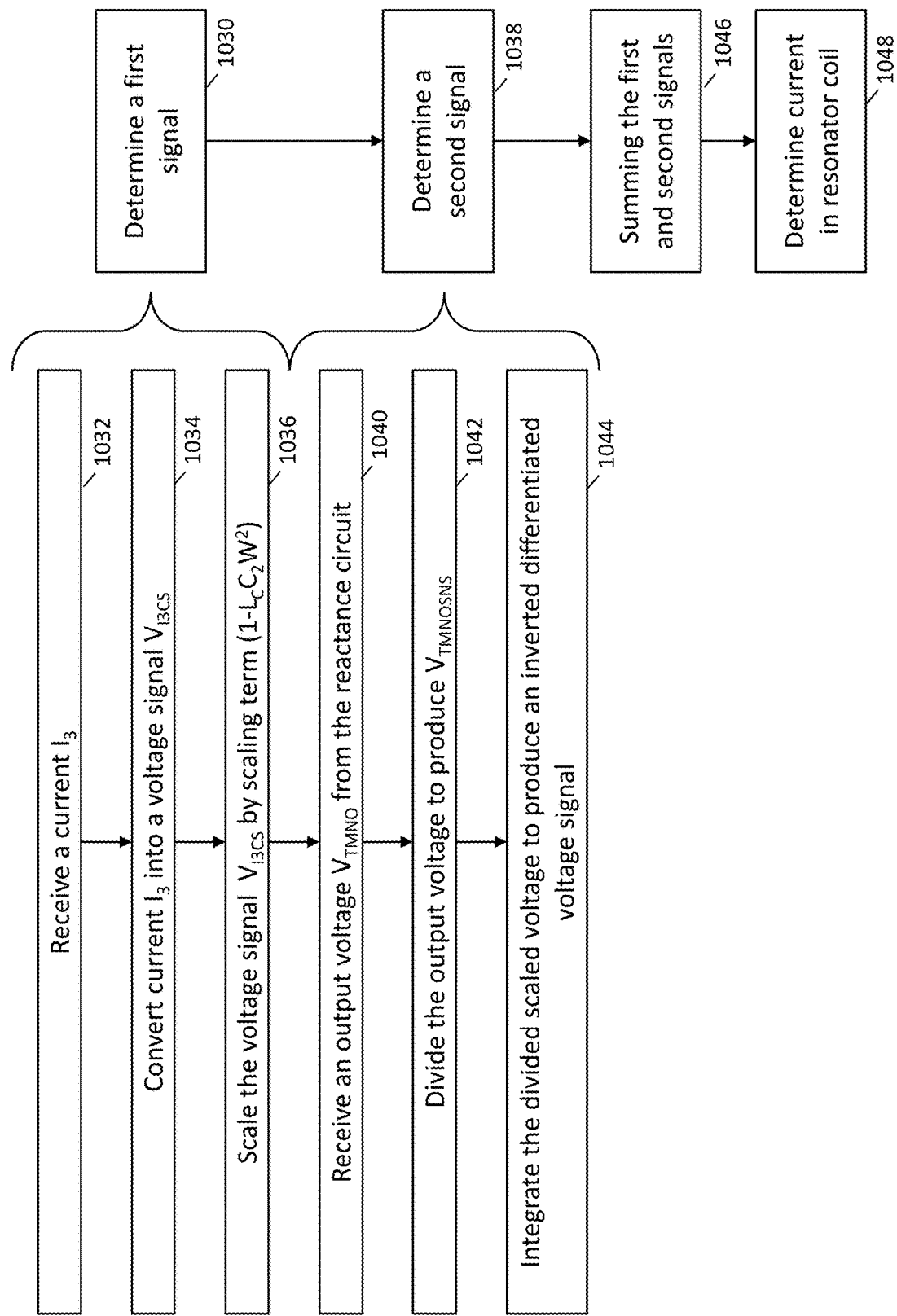
FIG. 10I is a flowchart of the exemplary method for determining current $I_1$ in the resonator coil.

FIG. 10F is a graph 1024 of current sense root-mean-square (RMS) error (in amperes A) as a function of cable inductances $L_C$=1 μH, 3 μH, and 5 μH, respectively, and operating point. FIG. 10G is a graph 1026 of current sense peak error (A) as a function of cable inductances $L_C$=1 μH, 3 μH, and 5 μH, respectively, and operating point. FIG. 10H is a graph 1028 of current sense peak error (in amperes A) as a function of cable inductance s $L_C$=1 μH, 3 μH, and 5 μH, respectively, and operating point post-calibration. The operating points along the x-axis of FIGS. 10F-10H are represented as tuples with elements x-offset, y-offset, z-offset and battery voltage (e.g., (0, 0, 140, 280)). The x-offset, y-offset, and z-offset refer to positioning of a receiver resonator coil 132 relative to the transmitter resonator coil 130 (refer to FIG. 1C and related description above). From left to right, the operating points include: (0, 0, 140, 280); (0, 0, 140, 350); (0, 0, 140, 420); (0, 0, 175, 280); (0, 0, 175, 350); (0, 0, 175, 420); (75, 100, 210, 280); (75, 100, 210, 350); and (75, 100, 210, 420).

The calibration process used to create FIG. 10H involves applying a first-order polynomial curve fit on the coil current determination system output as a function of actual coil current, then inputting the coil current determination system output into the equation from the curve fitting process to create an output that has the reduced error displayed in FIG. 10H (as compared to the non-calibrated error for the same system and/or method provided in FIGS. 10F-10G). A microcontroller can apply a similar curve fit equation to the coil current determination system output to get a reduced error as displayed in FIG. 10H.

As FIG. 10F illustrates, as the operating point progresses from less offset (e.g., (0, 0, 140, 280) to greater offset (e.g., (0, 0, 175, 280) or (75, 100, 210, 280)) in the x, y, and z axes, there is a significant increase in absolute value of RMS error of coil current $I_1$ for the control system and/or method 200. By contrast, the absolute value of the current $I_1$ RMS error for the system and/or method 1000 is steady or decreasing with increase in offset. Moreover, the error for the system and/or method 1000 is much lower than that of the control system and/or method 200 for most operating points.

FIG. 10G illustrates that the absolute value of the error for system and/or method 1000 is lower (e.g., less than 3 A) for most operating points as compared to control system and/or method 200 (e.g., greater than 4 A).

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described components and systems can generally be integrated together in a single product or packaged into multiple products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

What is claimed is:

1. A method for determining a current of a resonator coil during operation of a wireless power system having the resonator coil, the resonator coil coupled to a fixed capacitive network and a reactance circuit, the method comprising:
   determining a first signal comprising:
      receiving a current in an inductor of the reactance circuit;
      converting the current to a voltage signal; and
      scaling the voltage signal by a scaling term associated with a characteristic of a cable coupled between the reactance circuit and the fixed capacitive network;
   determining a second signal comprising:
      receiving an output voltage at an output of the reactance circuit;
      dividing, by a voltage divider, the output voltage; and
      integrating, by an integrator circuit, the divided scaled voltage to produce an inverted differentiated voltage signal;
   summing the first signal and the second signal to produce a summed signal; and
   determining the current in the resonator coil based on the summed signal.

2. The method of claim 1 wherein converting the current to a voltage signal is by a current sense transformer.

3. The method of claim 1 wherein the scaling term associated with the cable inductance is:
$1 - L_C C_2 \omega^2$ wherein $L_C$ is the cable inductance and $C_2$ is a capacitance value of a first set of capacitors of the fixed capacitive network, the first set of capacitors coupled in parallel to the resonator coil.

4. The method of claim 1 further comprising:
   filtering the summed signal prior to determining the current in the resonator coil.

5. The method of claim 4 wherein the filtering is by a bandpass filter.

6. The method of claim 4 wherein the filtering the summed signal produces a fundamental frequency component of the summed signal.

7. The method of claim 1 wherein determining the first signal further comprises:
   scaling the scaled voltage signal by a capacitance value of a first set of capacitors of the fixed capacitive network, the first set of capacitors coupled in parallel to the resonator coil.

8. The method of claim 1 wherein scaling the voltage signal by the scaling term associated with the inductance of the cable further comprises:
   adjusting a gain of the voltage signal based on an inductance of the cable coupled between the reactance circuit and the fixed capacitive network.

9. The method of claim 8 wherein the adjusting the gain is by an adjusting circuit.

10. The method of claim 1 wherein the characteristic of the cable is an inductance of the cable.

11. The method of claim 10 wherein the cable inductance is a function of at least one of: cable length, wire gauge, insulation spacing, or insulation permeability.

12. The method of claim 1 wherein determining the second signal further comprises:
   scaling the integrated voltage signal by a capacitance value of a first set of capacitors of the fixed capacitive network, the first set of capacitors coupled in parallel to the resonator coil.

13. The method of claim 1 further comprising:
   adjusting one or more adjustable components in the wireless power transmitter based on the determined current.

14. The method of claim 13 wherein the adjustable components comprise one or more transistors in the reactive circuit.

15. The method of claim 1 further comprising:
   applying a predetermined polynomial curve fit on the determined current in the resonator coil, the predetermined polynomial curve based on data collected on directly measured coil current.

16. A system for determining a current of a resonator coil during operation of a wireless power system having the resonator coil, the resonator coil coupled to a fixed capacitive network and a reactance circuit, the system comprising:
   a first sub-circuit comprising:
      a current sense transformer configured to receive a current in the reactance circuit and output a voltage signal proportional to the current; and
      a potentiometer divider and a gain stage, coupled to the current sense transformer and configured to scale the output voltage signal with a first gain to produce a first voltage signal, the first gain based on a characteristic of a cable coupled between the reactance circuit and the fixed capacitive network;
   a second sub-circuit comprising:
      a voltage divider configured to divide a voltage at an output of the reactance circuit; and an integrator, coupled to the voltage divider and configured to integrate the divided voltage signal to produce an inverted differentiated signal; and a summing operational amplifier coupled to the first and second sub-circuits and configured to produce a summed voltage signal.

17. The system of claim 16 further comprising:
a scaling circuit coupled to an output of the gain stage and configured to scale the output voltage signal with a first scaling term.

18. The system of claim 17 further comprising:
a scaling circuit coupled to the integrator and configured to scale the inverted differentiated signal with a second scaling term.

19. The system of claim 16 further comprising:
a bandpass filter coupled to the summing operational amplifier and configured to produce a voltage signal having a fundamental frequency component of the summed voltage signal.

20. The system of claim 16 further comprising:
a circuit configured to convert the summed voltage signal to a current signal.

* * * * *